United States Patent
Oliver et al.

(10) Patent No.: US 7,452,743 B2
(45) Date of Patent: Nov. 18, 2008

(54) MICROELECTRONIC IMAGING UNITS AND METHODS OF MANUFACTURING MICROELECTRONIC IMAGING UNITS AT THE WAFER LEVEL

(75) Inventors: Steven D. Oliver, Boise, ID (US); Lu Velicky, Boise, ID (US); William Mark Hiatt, Eagle, ID (US); David R. Hembree, Boise, ID (US); Mark E. Tuttle, Boise, ID (US); Sidney B. Rigg, Meridian, ID (US); James M. Wark, Boise, ID (US); Warren M. Farnworth, Nampa, ID (US); Kyle K. Kirby, Boise, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 282 days.

(21) Appl. No.: 11/217,877

(22) Filed: Sep. 1, 2005

(65) Prior Publication Data
US 2007/0045632 A1   Mar. 1, 2007

(51) Int. Cl.
*H01L 21/00* (2006.01)
(52) U.S. Cl. .............. 438/57; 438/68; 438/69; 438/73
(58) Field of Classification Search ............ 438/57, 438/65, 68, 64, 69, 70, 73
See application file for complete search history.

(56) References Cited

U.S. PATENT DOCUMENTS

| | | | |
|---|---|---|---|
| 6,197,181 B1 * | 3/2001 | Chen | 205/123 |
| 6,617,189 B1 * | 9/2003 | Chen et al. | 438/48 |
| 6,618,087 B1 | 9/2003 | Hokari et al. | |
| 2001/0029059 A1 | 10/2001 | Lin et al. | |
| 2004/0245649 A1 | 12/2004 | Imaoka | |
| 2005/0051883 A1 | 3/2005 | Fukazawa | |
| 2005/0104228 A1 | 5/2005 | Riggs et al. | |
| 2005/0184219 A1 | 8/2005 | Kirby | |

FOREIGN PATENT DOCUMENTS

| EP | 0 469 878 A1 | 2/1992 |
|---|---|---|
| EP | 1 267 402 A2 | 12/2002 |

OTHER PUBLICATIONS

International Search Report and Written Opinion dated Mar. 13, 2008 issued in Application No. PCT/US2006/034011.

* cited by examiner

*Primary Examiner*—Michael Trinh
(74) *Attorney, Agent, or Firm*—Dickstein Shapiro LLP

(57) ABSTRACT

Microelectronic imaging units and methods for manufacturing a plurality of imaging units at the wafer level are disclosed herein. In one embodiment, a method for manufacturing a plurality of imaging units includes providing an imager workpiece having a plurality of imaging dies including integrated circuits, external contacts electrically coupled to the integrated circuits, and image sensors operably coupled to the integrated circuits. The individual image sensors include at least one dark current pixel at a perimeter portion of the image sensor. The method includes depositing a cover layer onto the workpiece and over the image sensors. The method further includes patterning and selectively developing the cover layer to form discrete volumes of cover layer material over corresponding image sensors. The discrete volumes of cover layer material have sidewalls aligned with an inboard edge of the individual dark current pixels such that the dark current pixels are not covered by the discrete volumes.

34 Claims, 24 Drawing Sheets

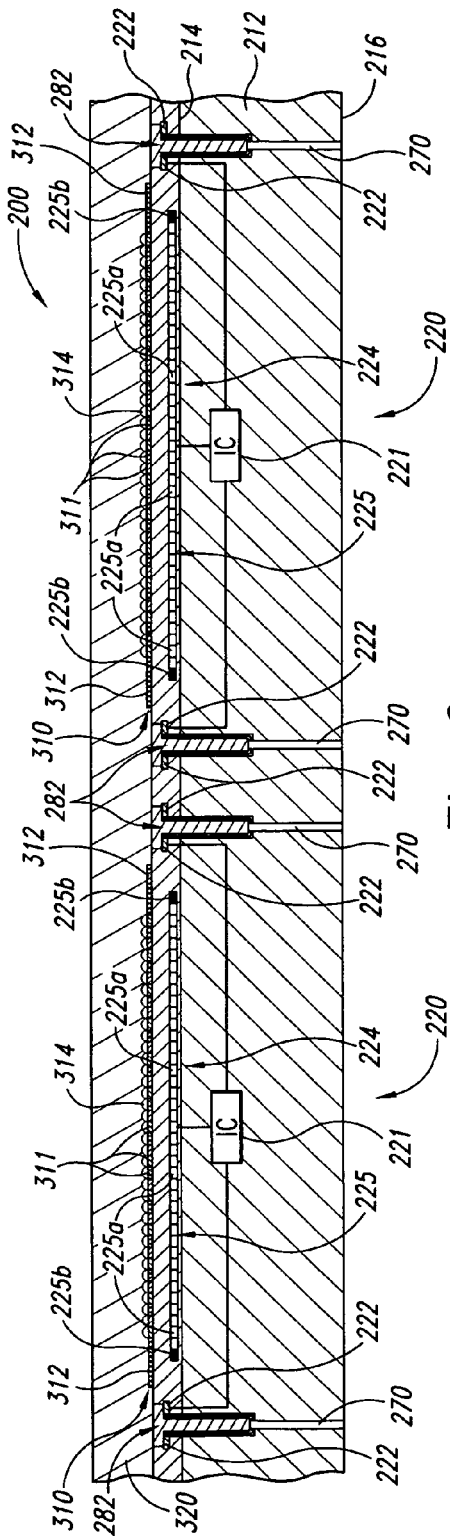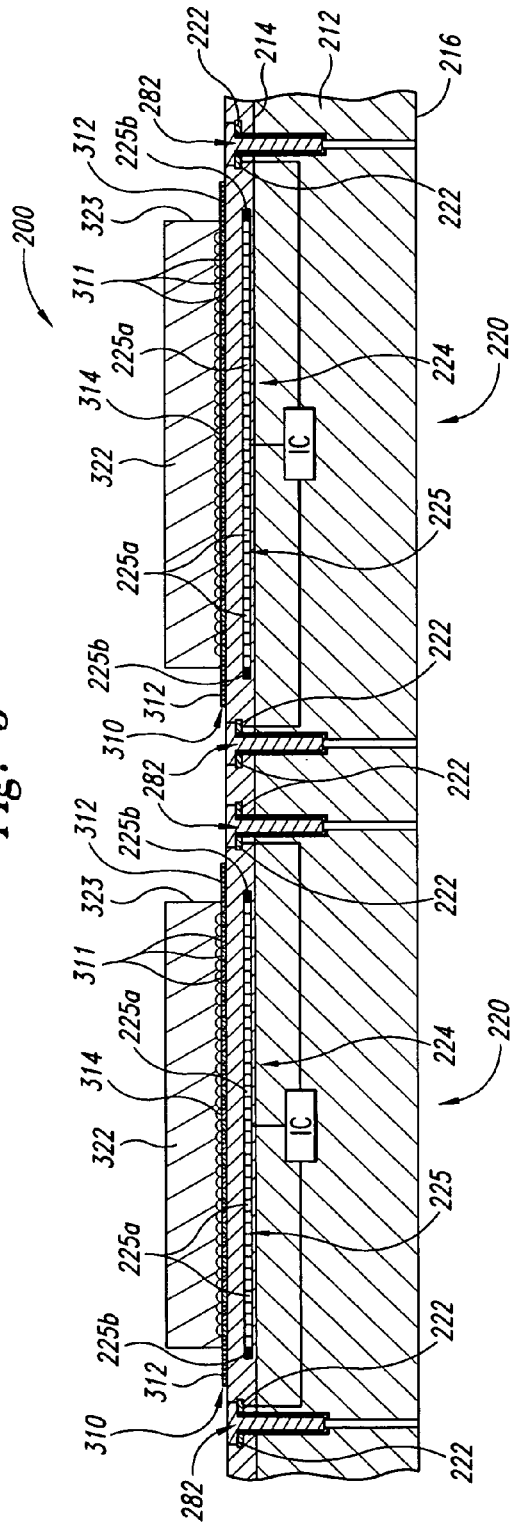
Fig. 3
Fig. 4A

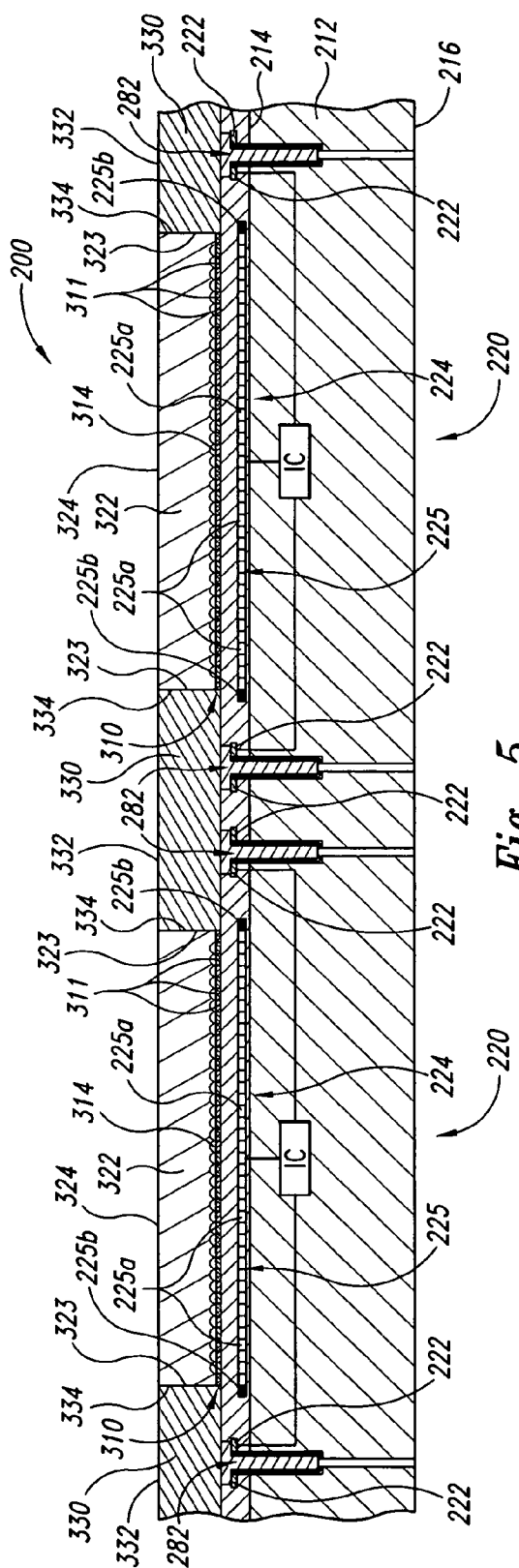
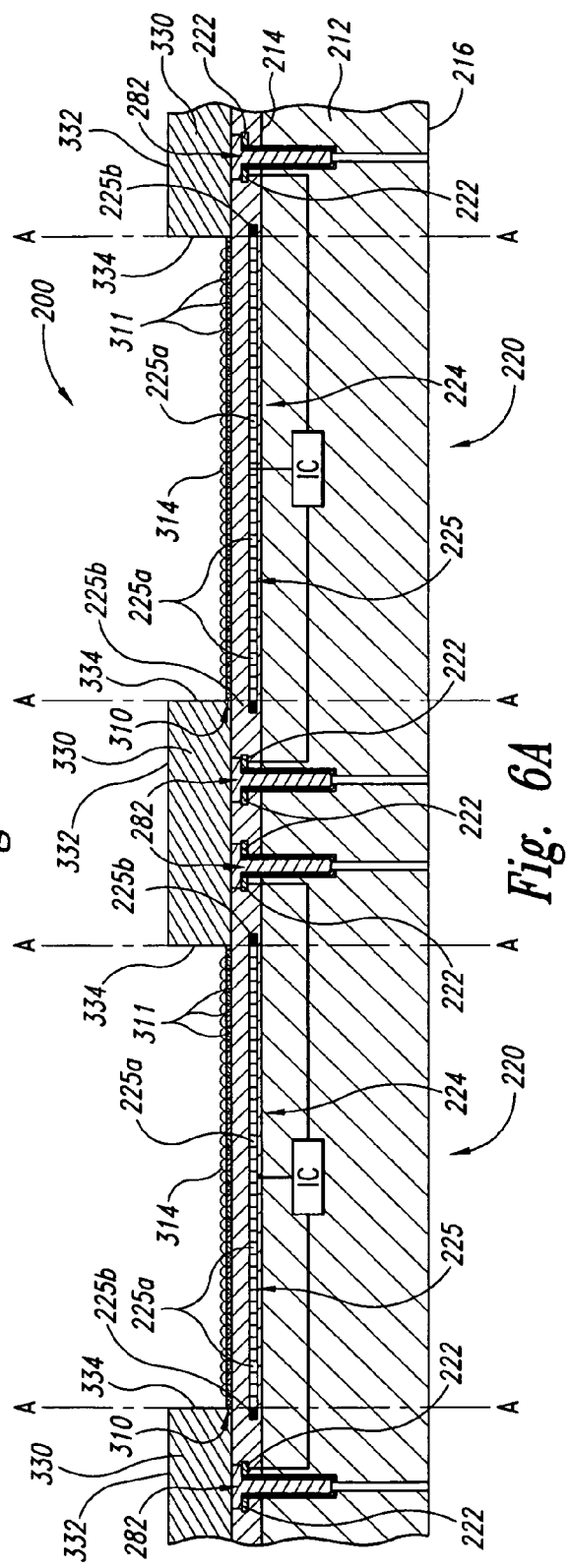
Fig. 5
Fig. 6A

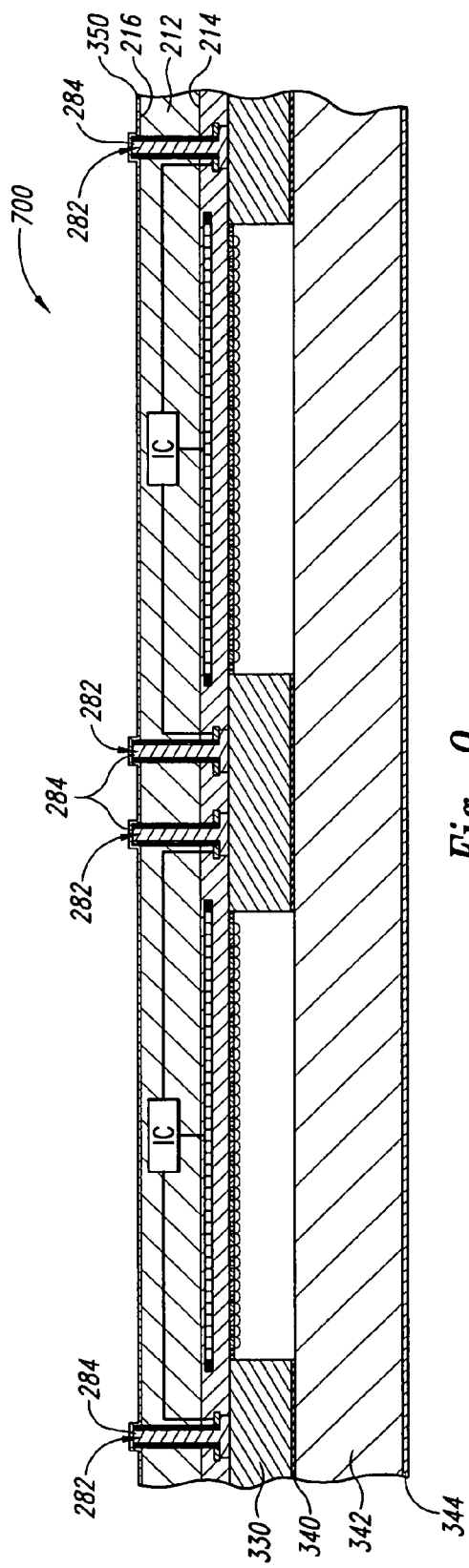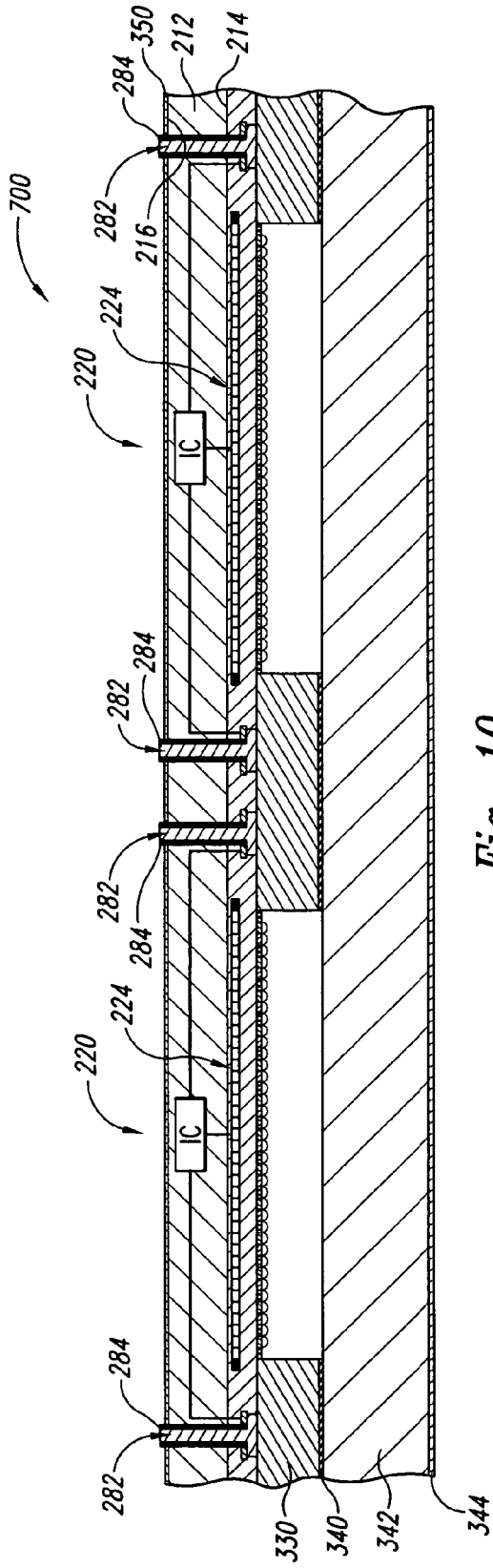

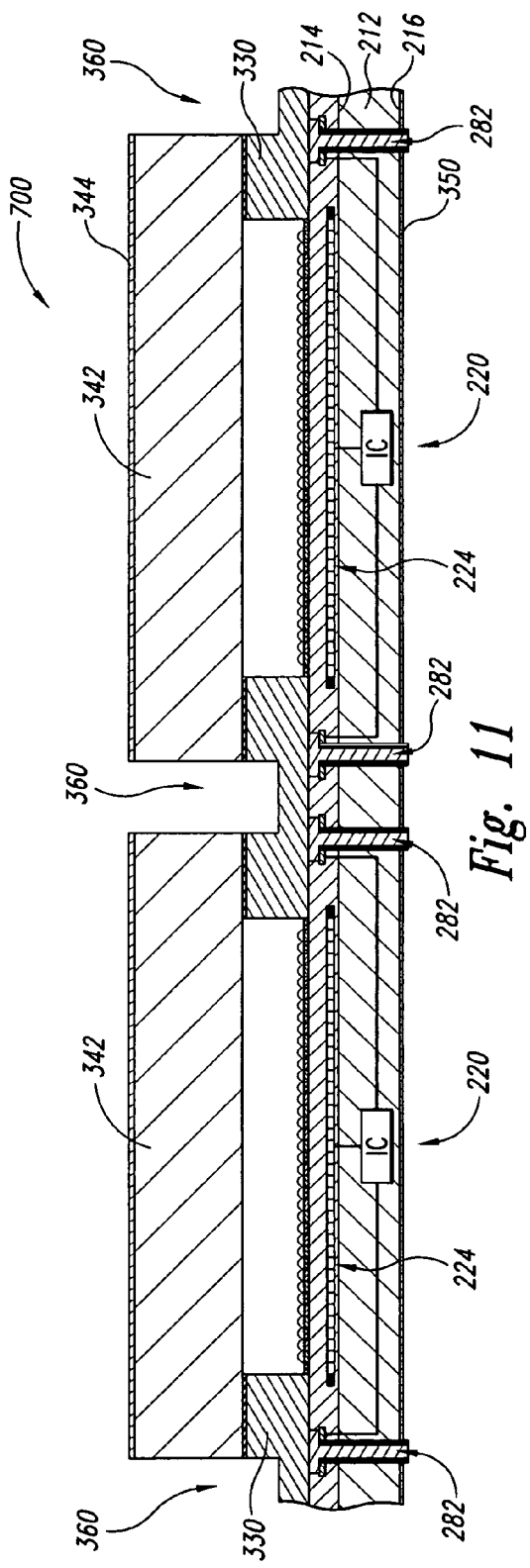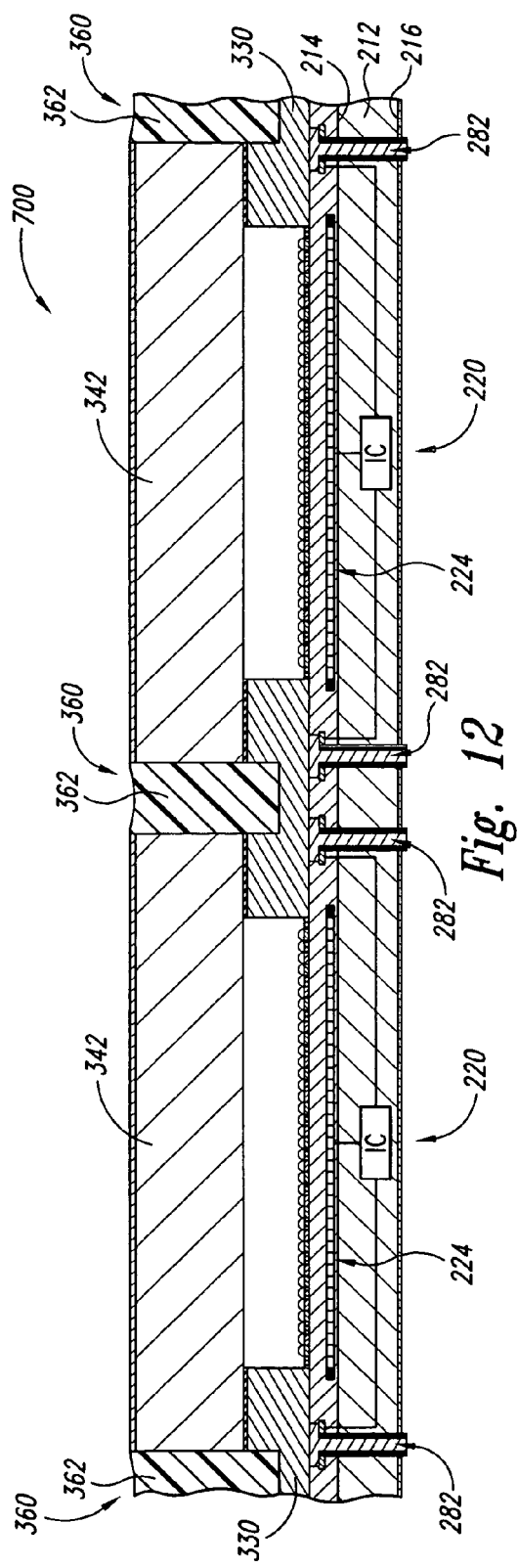

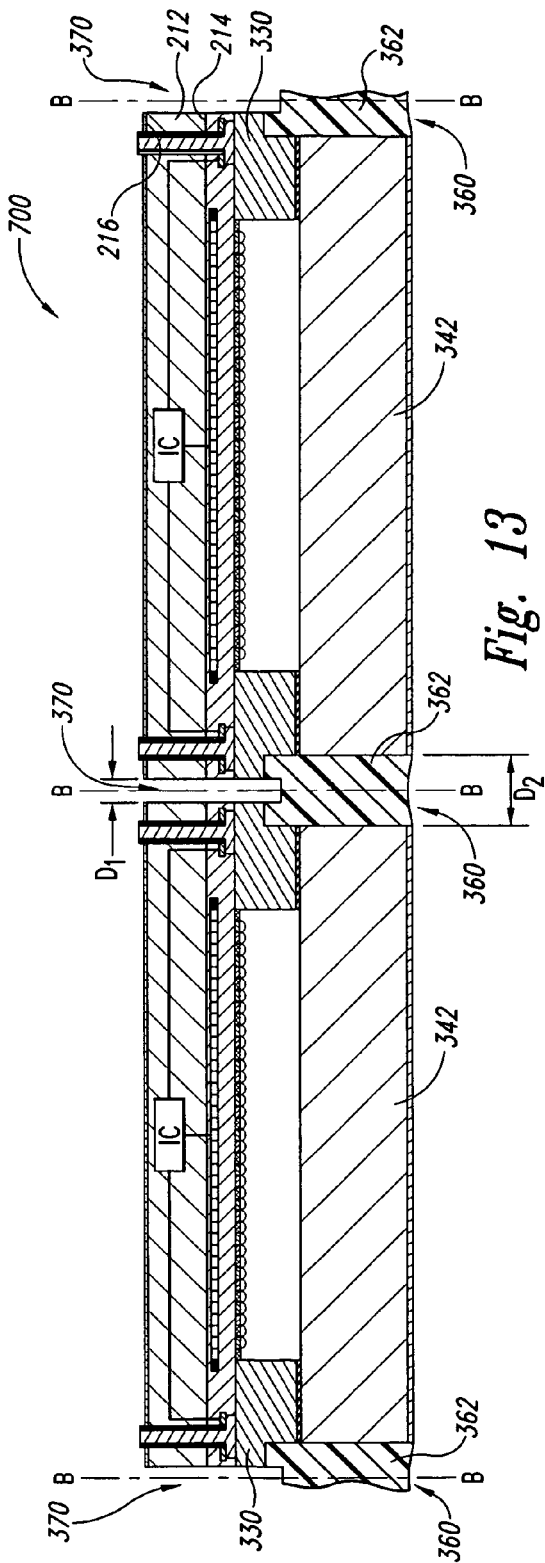
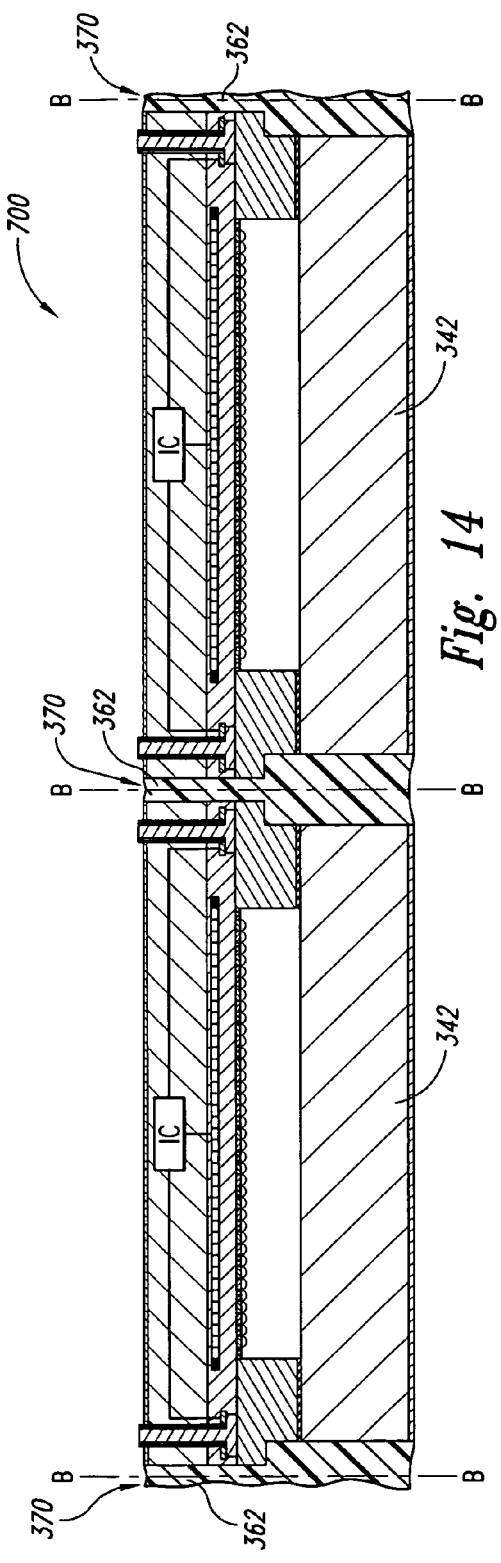

MICROELECTRONIC IMAGING UNITS AND METHODS OF MANUFACTURING MICROELECTRONIC IMAGING UNITS AT THE WAFER LEVEL

TECHNICAL FIELD

The present invention is related to microelectronic imaging units having image sensors and methods of manufacturing such imaging units at the wafer level.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other solid-state systems. CCD image sensors have been widely used in digital cameras and other applications. CMOS image sensors are also quickly becoming very popular because they are expected to have low production costs, high yields, and small sizes. CMOS image sensors can provide these advantages because they are manufactured using technology and equipment developed for fabricating semiconductor devices. CMOS image sensors, as well as CCD image sensors, are accordingly "packaged" to protect their delicate components and to provide external electrical contacts.

An image sensor generally includes an array of pixels arranged in a focal plane. Each pixel is a light sensitive element that includes a photogate, a photoconductor, or a photodiode with a doped region for accumulating a photo-generated charge. Microlenses and colored filter arrays are commonly placed over imager pixels. The microlenses focus light onto the initial charge accumulation region of each pixel. The photons of light can also pass through a color filter array (CFA) after passing through the microlenses and before impinging upon the charge accumulation region. Conventional technology uses a single microlens with a polymer coating, which is patterned into squares or circles over corresponding pixels. The microlens may be heated during manufacturing to shape and cure the microlens. Use of microlenses significantly improves the photosensitivity of the imaging device by collecting light from a large light-collecting area and focusing the light onto a small photosensitive area of the corresponding pixel.

The use of smaller-sized pixels is of increasing importance in microelectronic imagers because of the need to reduce the size of imager devices and increase imager resolution. Reducing pixel size, however, increases the problem of "noise" or background signals present in the image sensor readout when no light is incident upon the image sensor. This noise, referred to as "dark current," is the result of electron activity within the substrate material carrying the image sensor. More specifically, the dark current is a result of thermally emitted charges being collected in the charge accumulation regions of the pixels. The magnitude of the dark current is dependent upon the image sensor architecture and the operating temperature.

One method of compensating for dark current is by masking off a set of pixels at a perimeter of the image sensor so that they are not exposed to light. Because the incident light is blocked from entering these pixels, the signal contained in these pixels is due only to dark current. These dark reference pixels are used as a "black level" reference for calibrating the image sensor output. One problem, however, is that it is difficult to accurately partition the dark reference pixels at the perimeter of the image sensor from the adjoining active pixels because the extremely small pixels are positioned very close together. For example, dark reference pixels in close proximity to the outer bounds of the image sensor can scavenge signal from the incident light because the dark reference pixels are not completely shielded. Accordingly, the measured dark current may not represent the true dark signal of the image sensor in such circumstances. Further, it is not desirable to move the dark reference pixels further outboard of the active pixels to avoid the problems with incident light because it will increase the size of the image sensor. Therefore, there is a need to enhance the performance and precision of packaging microelectronic imagers.

BRIEF DESCRIPTION OF THE DRAWINGS

FIG. 3 is a side cross-sectional view illustrating a portion of an imager workpiece having a plurality of imaging dies with electrically conductive interconnects formed in accordance with the methods described in FIGS. 2A-2O.

FIG. 4A is a side cross-sectional view of the portion of the workpiece after patterning and developing a photoactive layer to form a plurality of discrete volumes of photoactive material on the workpiece.

FIG. 5 is a side cross-sectional view of the portion of the workpiece after depositing an opaque material onto the workpiece.

FIG. 6A is a side cross-sectional view of the portion of the workpiece after removing the photoactive material from the workpiece.

FIG. 9 is a side cross-sectional view of the portion of the workpiece after depositing a dielectric layer onto the backside of the workpiece.

FIG. 10 is a side cross-sectional view of the portion of the workpiece after removing a portion of the dielectric layer from the backside of the workpiece.

FIG. 11 is a side cross-sectional view of the portion of the workpiece after forming a plurality of trenches in the cover substrate.

FIG. 12 is a side cross-sectional view of the portion of the workpiece after filling the trenches in the cover substrate with packaging material.

FIG. 13 is a side cross-sectional view of the portion of the workpiece after forming a plurality of trenches in the workpiece.

FIG. 14 is a side cross-sectional view of the portion of the workpiece after filling the trenches in the workpiece with packaging material.

DETAILED DESCRIPTION

A. Overview/Summary

Figure 1:
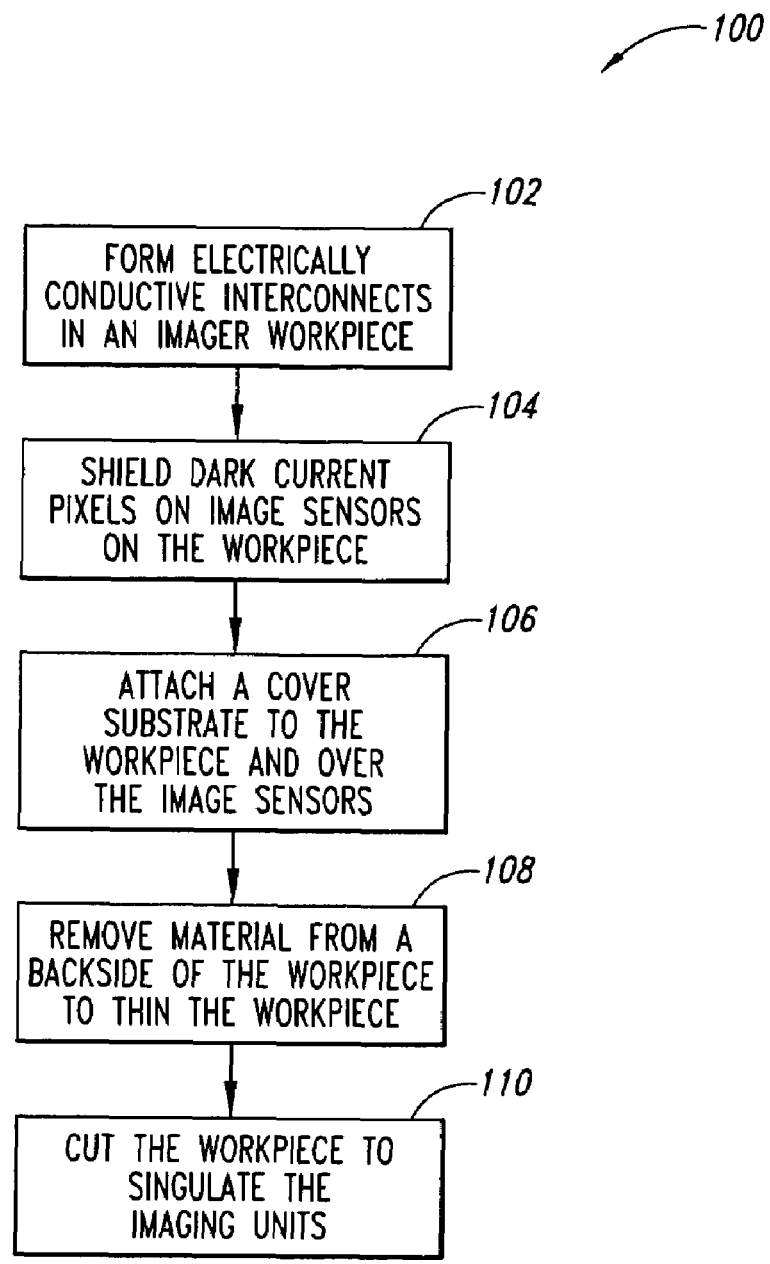
FIG. 1 is a flow chart illustrating a method of packaging microelectronic imaging units at the wafer level in accordance with an embodiment of the invention.

The following disclosure describes several embodiments of (1) methods for wafer-level packaging of microelectronic imaging units, (2) methods of forming electrically conductive interconnects in imaging units, (3) methods for shielding or otherwise covering dark current pixels on the image sensors of the imaging units, and (4) imaging units that have been packaged using such wafer-level packaging processes. One aspect of the invention is directed toward methods for manufacturing a plurality of imaging units. An embodiment of one such method includes providing an imager workpiece having a plurality of imaging dies including integrated circuits, external contacts electrically coupled to the integrated circuits, and image sensors operably coupled to the integrated circuits. The individual image sensors include at least one dark current pixel at a perimeter portion of the image sensor. The method also includes depositing a cover layer onto the workpiece and over the image sensors, and patterning and selectively developing the cover layer to form discrete volumes of cover layer material over corresponding image sensors. The discrete volumes of cover layer material have sidewalls aligned with an inboard edge of the individual dark current pixels such that the dark current pixels are not covered by the discrete volumes. In several embodiments, the method can further include depositing an opaque material onto the workpiece between the discrete volumes of cover layer material and over the dark current pixels, and subsequently removing the discrete volumes of cover layer material from the workpiece. The opaque material shields the dark current pixels and provides a stand-off for a glass cover or other optics. Several embodiments of this method form image sensors with small footprints and adequately shield the dark current pixels because the precise sidewalls of the discrete volumes of cover layer material enable the opaque material to have sidewalls located with a precise region between the active pixels and dark current pixels.

Another aspect of the invention is directed to methods of manufacturing an imaging die. An embodiment of one such method includes constructing an array of pixels on and/or in a substrate. The array of pixels includes a dark pixel at a perimeter portion of the array and an active pixel adjacent to an inboard edge of the dark pixel. The method also includes depositing a photoactive layer onto the substrate and over the array of pixels, patterning the photoactive layer, and selectively developing the photoactive layer to form a discrete block of photoactive material over the array of pixels. The discrete block has a sidewall aligned with the inboard edge of the dark pixel such that the dark pixel is not covered by the discrete block and the active pixel is completely covered by the discrete block. The method further includes depositing an opaque material onto the substrate and over the dark pixel to shield the dark pixel from light directed toward the active pixels. The method then includes removing the photoactive block from the substrate.

Another aspect of the invention is directed toward microelectronic imager workpieces. In one embodiment, the imager workpiece can include a substrate and a plurality of imaging dies in and/or on the substrate. The individual imaging dies include an integrated circuit, external contacts electrically coupled to the integrated circuit, and an image sensor operably coupled to the integrated circuit. The image sensor includes a dark current pixel at a perimeter portion of the image sensor. The imager workpiece further includes a photoactive layer on the substrate. The photoactive layer includes a plurality of discrete volumes of photoactive material over the individual image sensors. The individual discrete volumes have sidewalls aligned with an inboard edge of the individual dark current pixels such that the individual dark current pixels are not covered by the discrete volumes of photoactive material.

Specific details of several embodiments of the invention are described below with reference to CMOS image sensors to provide a thorough understanding of these embodiments, but other embodiments can use CCD image sensors or other types of solid-state imaging devices. Several details describing structures or processes that are well known and often associated with other types of microelectronic devices are not set forth in the following description for purposes of brevity. Moreover, although the following disclosure sets forth several embodiments of different aspects of the invention, several other embodiments of the invention can have different configurations or different components than those described in this section. As such, the invention may have other embodiments with additional elements or without several of the elements described below with reference to FIGS. 1-16.

B. Methods for Wafer-Level Packaging of Microelectronic Imaging Units

FIG. 1 is a flow chart of a method 100 for wafer-level packaging of a plurality of microelectronic imaging units. The method 100 includes forming electrically conductive interconnects in an imager workpiece at stage 102. The imager workpiece can include a substrate and a plurality of imaging dies formed in and/or on the substrate. The individual dies include an image sensor and a plurality of external contacts (e.g., the interconnects formed in stage 102) electrically coupled to the image sensor. At stage 104, the method 100 includes shielding dark current pixels on the individual image sensors. The wafer-level shielding process is expected to significantly enhance the performance of microelectronic imagers because the shielding process uses highly accurate and efficient processes to align the shielding material with the dark current pixels such that the dark current pixels do not scavenge radiation from adjacent pixels and the size of the array is reduced. Additional wafer-level packaging steps can then be performed on the workpiece. For example, the method 100 includes attaching a cover substrate to the workpiece and over the image sensors at stage 106, removing material from a backside of the substrate to thin the workpiece at stage 108, and cutting the workpiece to singulate the imaging units at stage 110.

The individual steps of the method 100 for packaging microelectronic imaging units set forth above with respect to FIG. 1 and microelectronic imaging units that are packaged at the wafer level using such methods are described in detail below. More specifically, embodiments of methods for forming electrically conductive interconnects in the workpiece are described in more detail below under heading C, entitled "Methods for Forming Interconnects in Imager Workpieces;" embodiments of methods for shielding dark current pixels on the individual image sensors are described in detail below under heading D, entitled "Methods for Shielding Dark Current Pixels on Imager Workpieces;" and wafer-level packaging of a plurality of microelectronic imaging units is described in greater detail under heading E, entitled "Wafer-Level Packaged Microelectronic Imaging Units." Additionally, several embodiments of microelectronic imaging units are also described below.

C. Methods for Forming Interconnects in Imager Workpieces

Figure 2A:
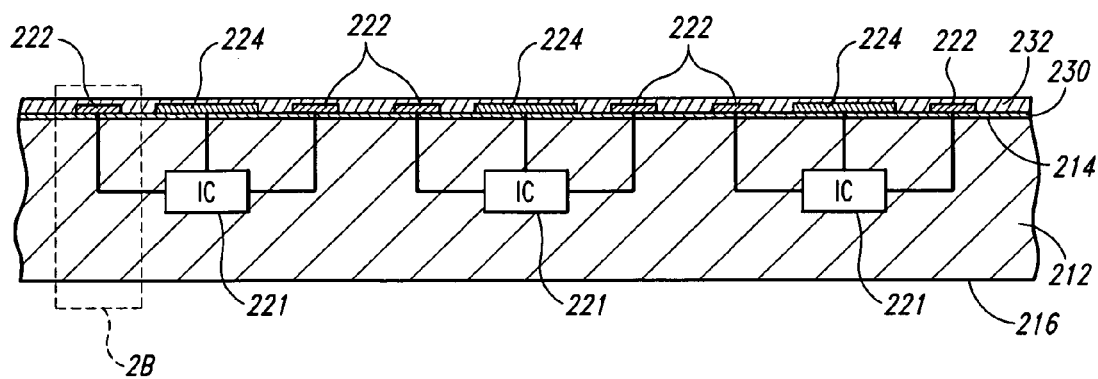
FIGS. 2A-2O are side cross-sectional views illustrating stages of a method for forming electrically conductive interconnects for providing a backside array of contact pads in accordance with an embodiment of the invention for use in wafer-level packaging of microelectronic imaging units.

FIGS. 2A-2O illustrate various stages of a method for forming interconnects in a microelectronic imager workpiece in accordance with an embodiment of the method 100 (FIG. 1) described above. FIG. 2A, for example, is a side cross-sectional view of a portion of an imager workpiece 200 at an initial stage before the interconnects have been formed. The workpiece 200 can include a substrate 212 and a plurality of imaging dies 220 formed in and/or on the substrate 212. The substrate has a first side 214 and a second side 216. The substrate 212 is generally a semiconductor wafer, and the imaging dies 220 are arranged in a die pattern on the wafer. Individual dies 220 can include integrated circuitry 221, a plurality of terminals 222 (e.g., bond-pads) electrically coupled to the integrated circuitry 221, and an image sensor 224. The image sensors 224 can be CMOS image sensors or CCD image sensors for capturing pictures or other images in the visible spectrum. In other embodiments, the image sensors 224 can detect radiation in other spectrums (e.g., IR or UV ranges). The image sensors 224 are described in more detail below with reference to FIG. 3. The terminals 222 shown in FIG. 2A are external features at the first side 214 of the substrate 212. In other embodiments, however, the terminals 222 can be internal features that are embedded at an intermediate depth within the substrate 212.

Figure 2B:
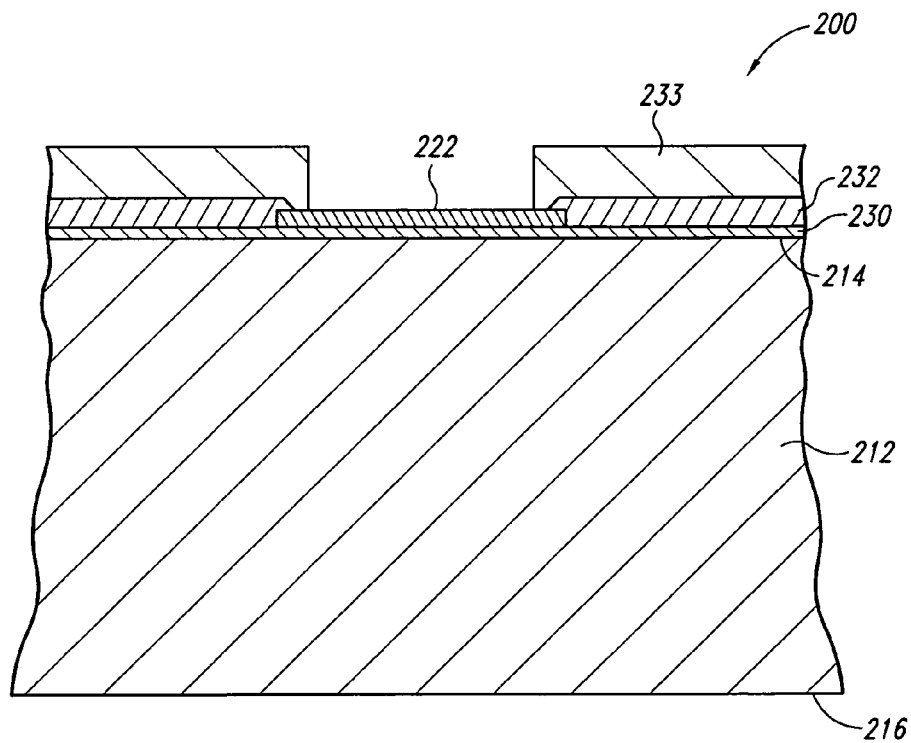

FIG. 2B is a side cross-sectional view of the area 2B shown in FIG. 2A. In previous processing steps, a first dielectric layer 230 was applied to the first side 214 of the substrate 212, and a second dielectric layer 232 was applied over the first dielectric layer 230. The second dielectric layer 232 was then patterned and etched to expose the terminal 222. The dielectric layers 230 and 232 can be a polyimide material, but these dielectric layers can be other nonconductive materials in other embodiments. For example, the first dielectric layer 230 and/or one or more of the subsequent dielectric layers can be parylene, a low temperature chemical vapor deposition (low temperature CVD) material such as silicon nitride ($Si_3N_4$), silicon oxide ($SiO_2$), and/or other suitable materials. The foregoing list of dielectric materials is not exhaustive. The dielectric layers 230 and 232 are not generally composed of the same material as each other, but these layers may be composed of the same material. In addition, one or both of the layers 230 and 232 may be omitted and/or additional layers may be included. After depositing the second dielectric layer 232, a mask 233 is applied over the second dielectric layer 232 and patterned as shown in FIG. 2B. The mask 233 can be a layer of resist that is patterned according to the arrangement of terminals 222 on the substrate 212. As such, the mask 233 has an opening over the terminal 222.

Figure 2C:
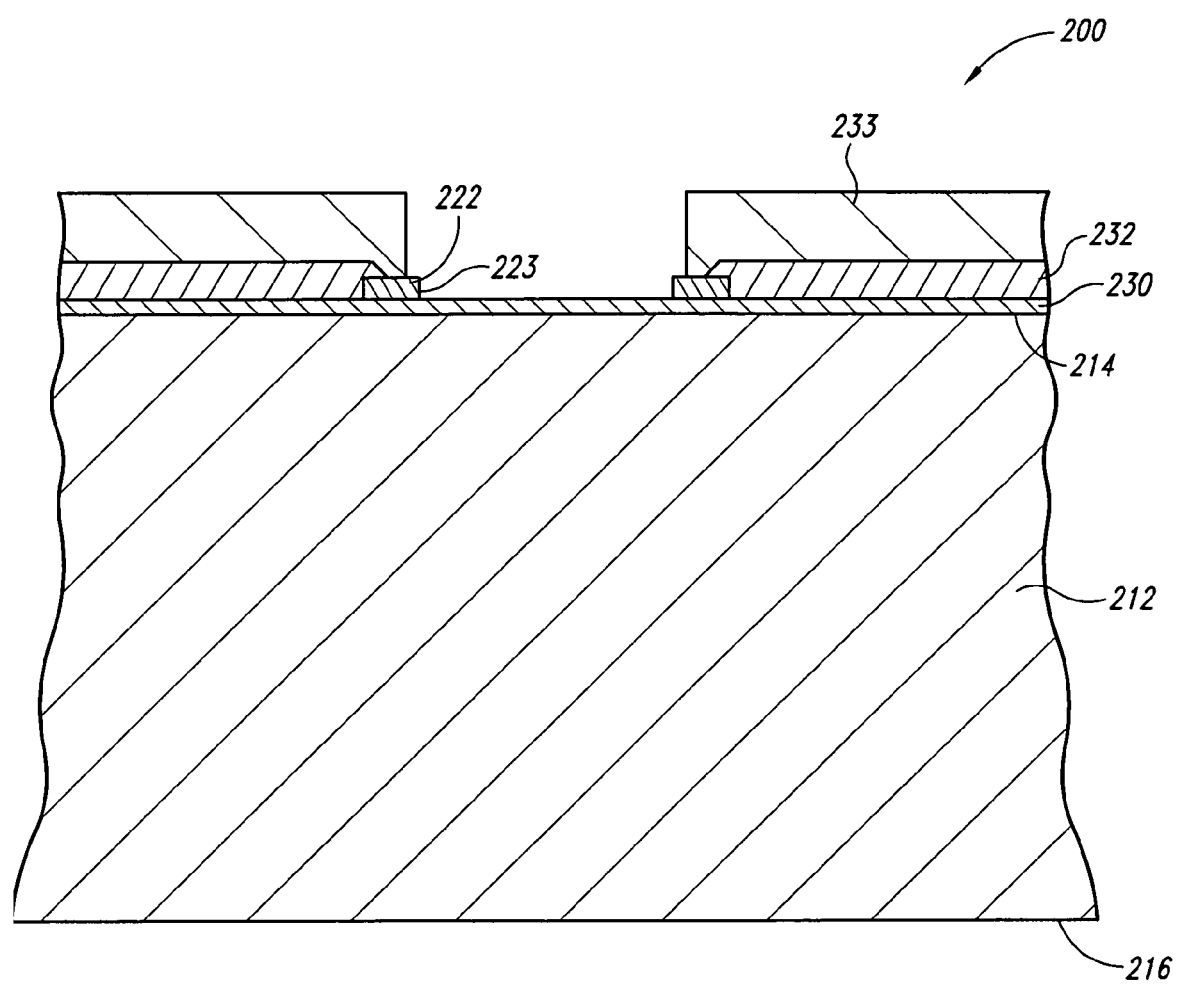

Referring to FIG. 2C, a hole or aperture 223 has been formed through the terminal 222. The hole 223 can be formed using a wet etching or dry etching process that selectively removes material from the terminal 222 compared to the first dielectric layer 230. The first dielectric layer 230 can accordingly be an etch-stop. In embodiments where the terminal 222 includes more than one type of metal, the etching process can be repeated until the hole 223 extends through the terminal 222.

Figure 2D:
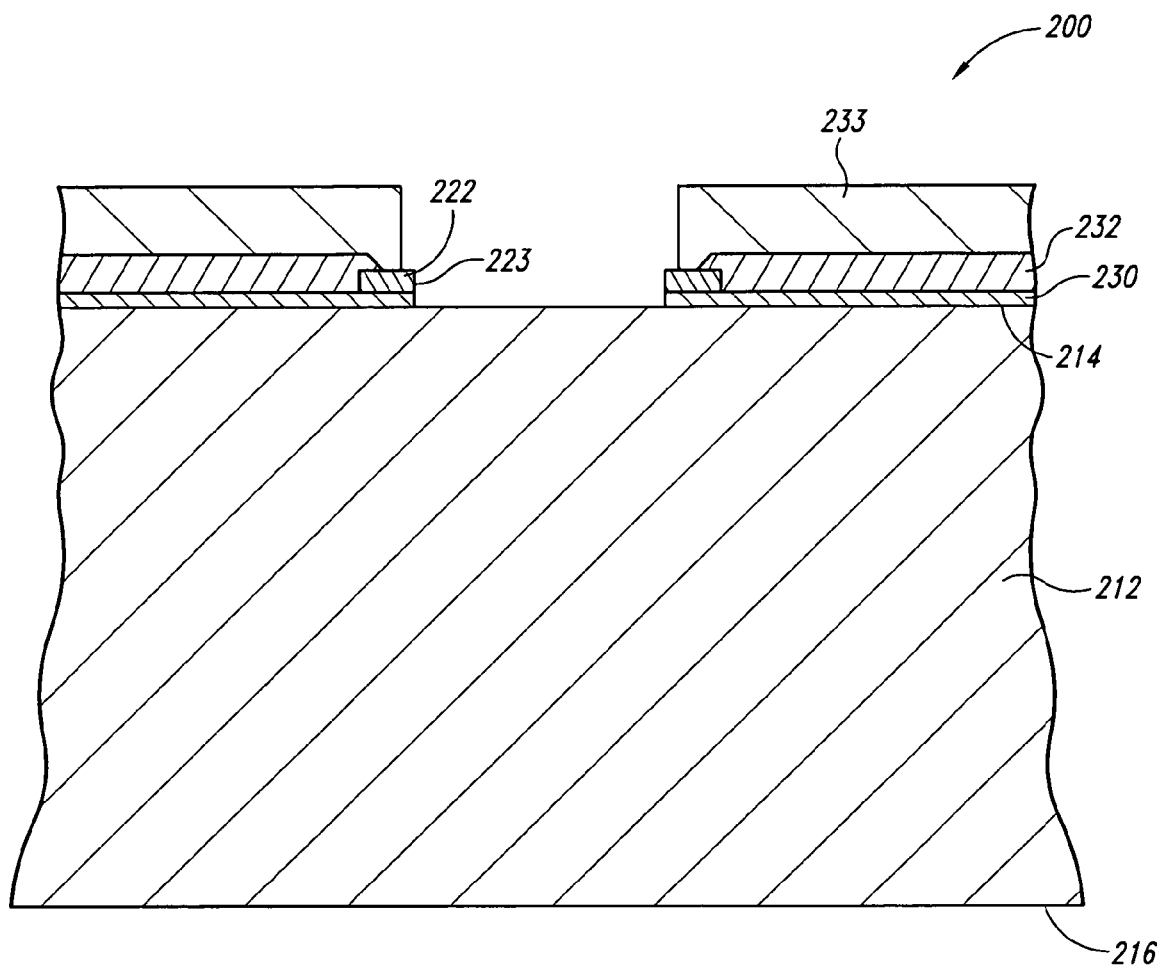

Referring to FIG. 2D, the first dielectric layer 230 directly beneath the terminal 222 is etched to expose at least a portion of the substrate 212. The second etching process for the first dielectric layer 230 can be different than the first etching process for the terminal 222. For example, the second etching process can selectively remove material from the first dielectric layer 230 at a higher etch rate than from either the terminal 222 or the substrate 212. The second etching process accordingly does not significantly alter the general structure of the terminal 222 or the substrate 212. In an alternative embodiment, the hole 223 can be etched through both the terminal 222 and the first dielectric layer 230 using a single etching process.

Figure 2E:
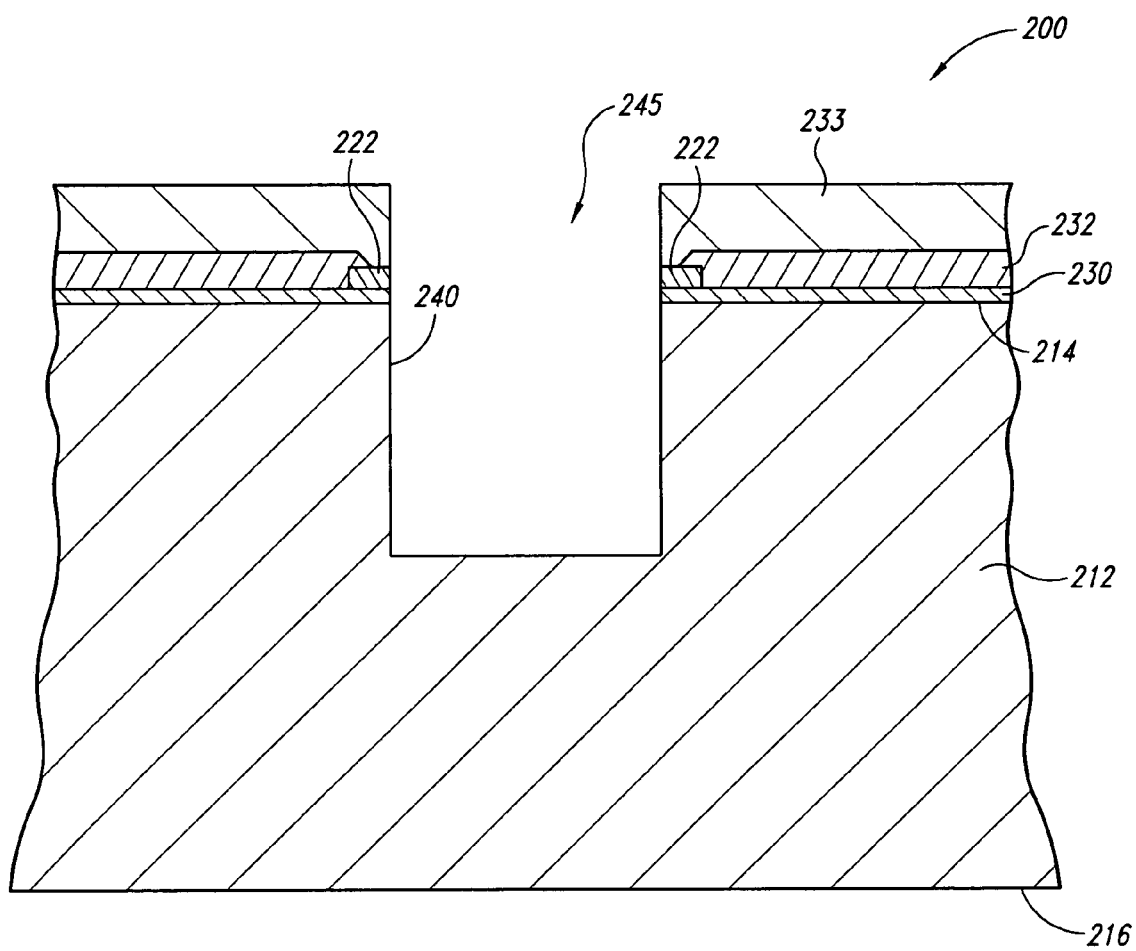

Referring to FIG. 2E, the mask 233 is used again on the workpiece 200 to form a sidewall 240 through at least part of the substrate 212 to define a blind hole 245. For purposes of this specification, a "blind hole" or "blind via" refers to a hole or aperture that extends only partially through the substrate 212 or is otherwise closed at one end. The blind hole 245 is formed by etching into the substrate 212 using one or more individual etches. After forming the blind hole 245, the mask 233 is removed from the workpiece 200. In an alternative embodiment, the workpiece 200 can be thinned and a through-hole can be etched completely through the remaining thickness of the workpiece 200.

The blind hole 245 can alternatively be formed using laser ablation in addition to or in lieu of etching. If a laser is used to form all or a portion of the blind hole 245, the mask 233 may be eliminated and the blind hole 245 is typically cleaned using chemical cleaning agents to remove slag or other contaminants. In yet another alternative embodiment, a laser can cut a through-hole completely through the thickness of the workpiece 200 either before or after thinning the workpiece. Although laser cutting the blind hole 245 may be advantageous because the substrate 212 does not need to be patterned (i.e., the mask 233 would not need to be applied), etching the blind hole 245 may be easier because the slag does not need to be cleaned from the blind hole 245 and the depth of the blind hole 245 can be more precisely controlled with an etching process. Moreover, the blind holes 245 can generally be more precisely aligned using an etching process than with a laser cutting process. A further advantage of using an etching process is that the first side 214 of the substrate 212 can be patterned and etched to simultaneously form a plurality of blind holes 245 aligned with corresponding terminals 222.

Figure 2F:
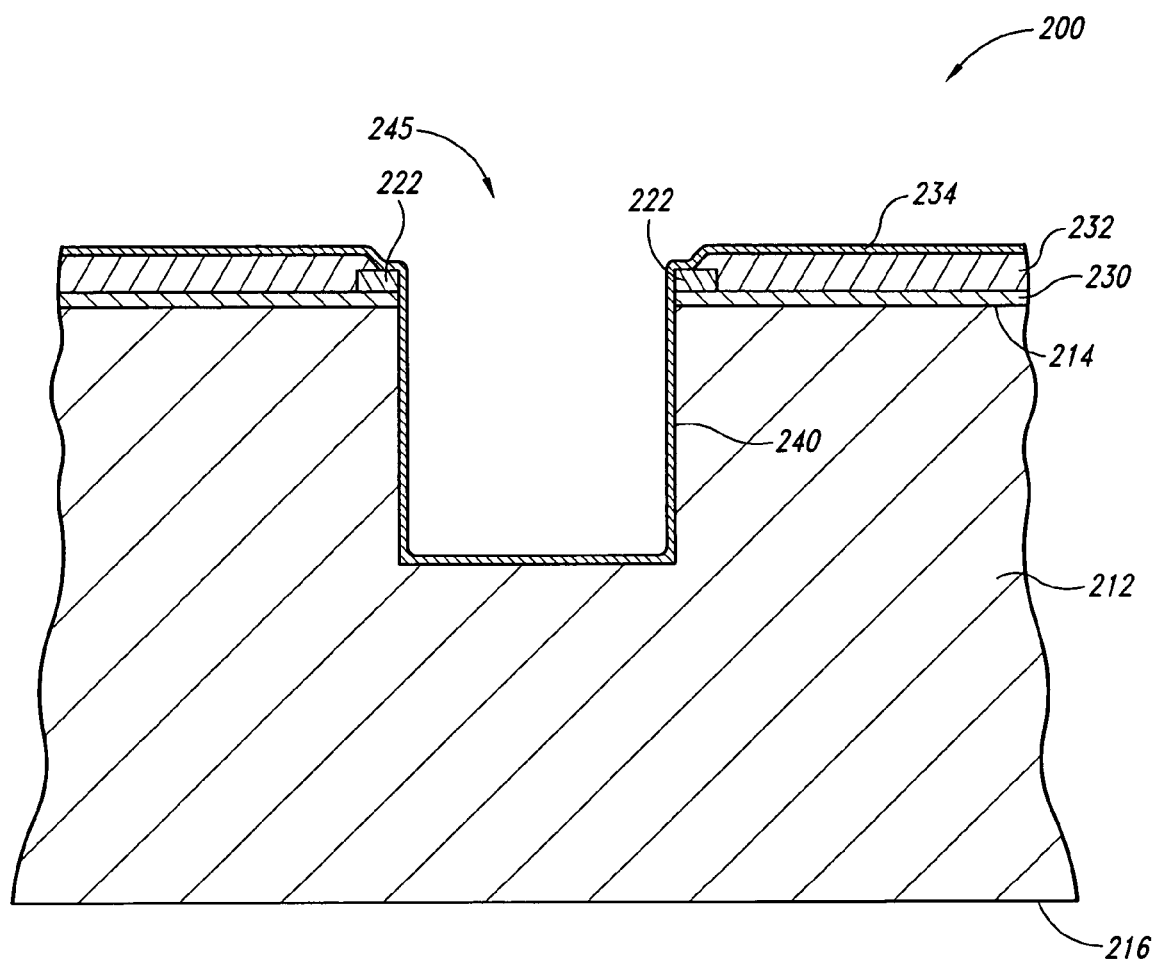
Figure 2G:
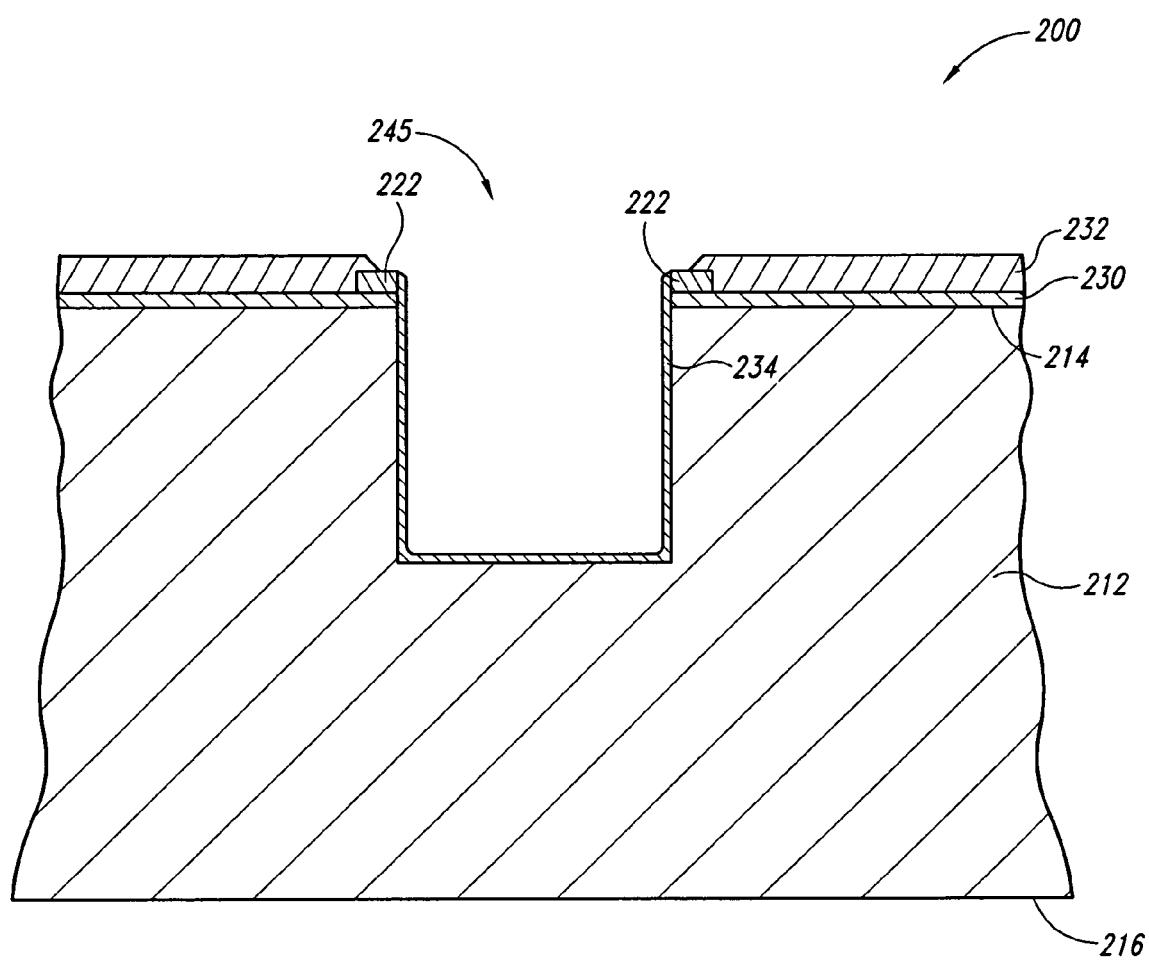

Referring next to FIG. 2F, a third dielectric layer 234 is deposited onto the workpiece 200 to line the sidewalls of the blind hole 245 within the substrate 212. The third dielectric layer 234 electrically insulates components in the substrate 212 from an interconnect that is subsequently formed in the blind hole 245, as described in greater detail below. In one embodiment, the third dielectric layer 234 can be an aluminum-rich oxide material applied using a suitable deposition process or another suitable low temperature CVD oxide. In another embodiment, the third dielectric layer 234 can include a silane-based and/or an aluminum-based oxide material. In still further embodiments, the third dielectric layer 234 can include other suitable dielectric materials. Referring to FIG. 2G, a suitable etching process (e.g., a spacer etch) is used to remove the third dielectric layer 234 from at least a portion of the terminal 222 and the first side 214 of the substrate 212.

Figure 2H:
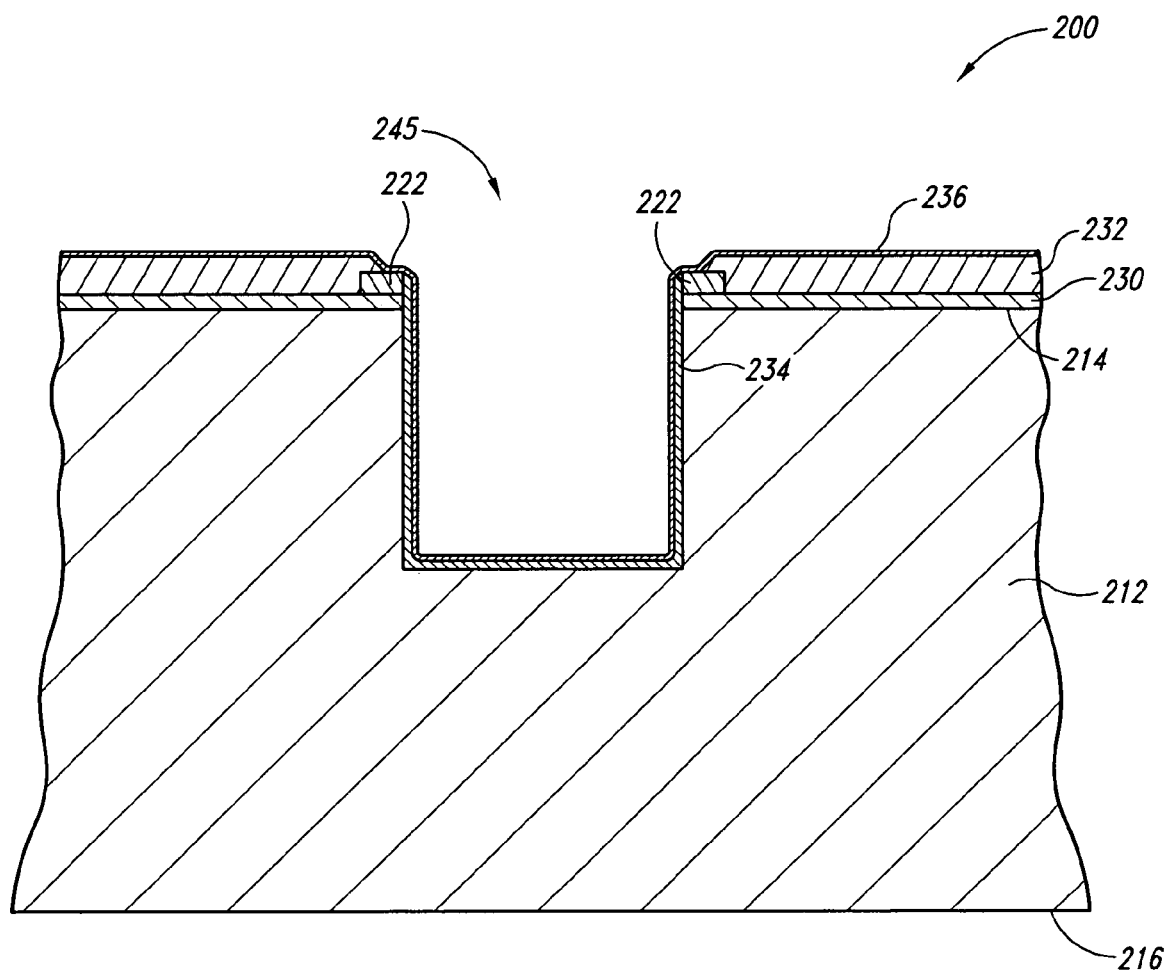

Referring to FIG. 2H, a diffusion barrier layer 236 is then deposited onto the workpiece 200 over the third dielectric layer 234 and in electrical contact with the terminal 222. The barrier layer 236 generally covers the second dielectric layer 232 and the terminal 222 in addition to the third dielectric layer 234. In one embodiment, for example, the barrier layer 236 is a layer of tantalum that is deposited onto the workpiece 200 using physical vapor deposition (PVD). The thickness of the barrier layer 236 is about 150 Angstroms. In other embodiments, the barrier layer 236 may be deposited onto the workpiece 200 using other vapor deposition processes, such as CVD, and/or may have a different thickness. The barrier layer 236 is not limited to tantalum, but rather may be composed of tungsten or other suitable materials that help contain the fill material subsequently deposited into the blind hole 245.

Figure 2I:
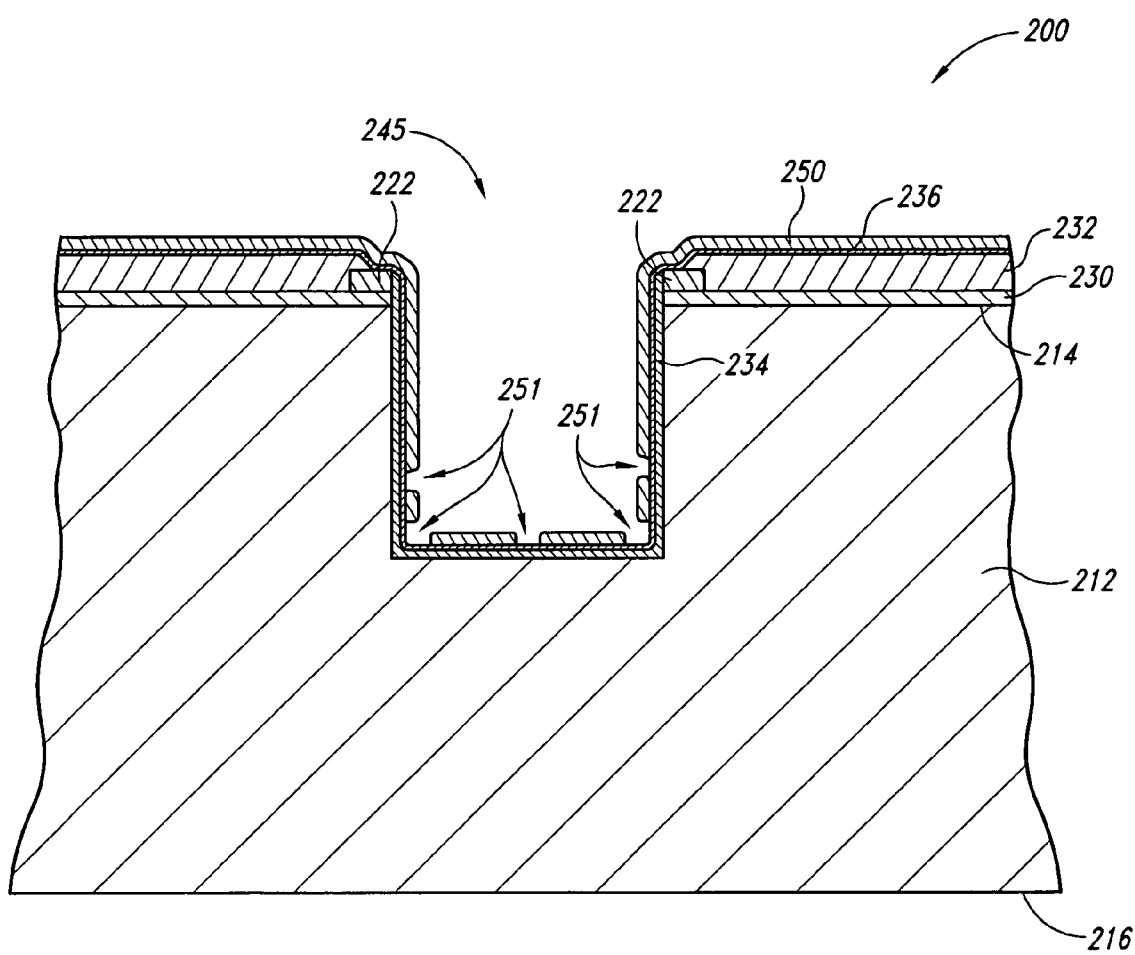
Figure 2J:
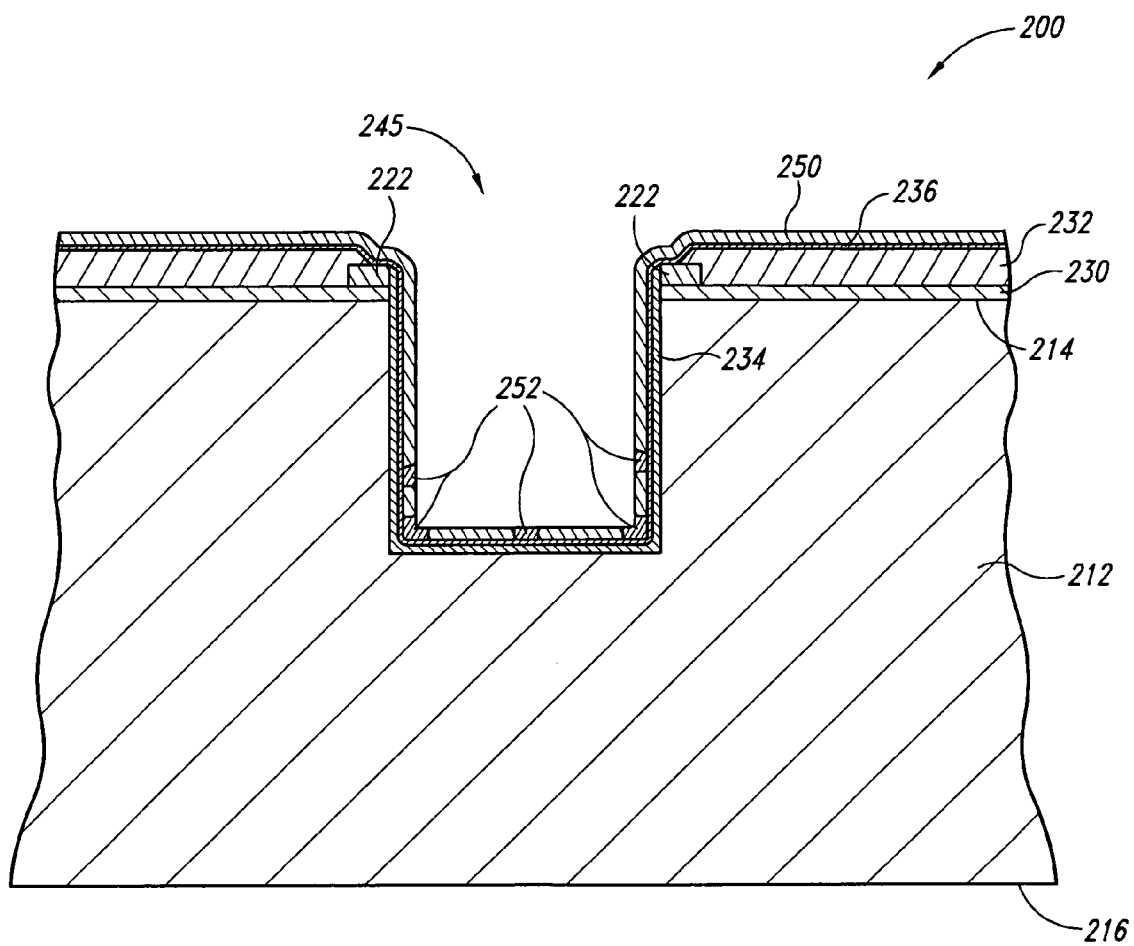

Referring next to FIG. 2I, a seed layer 250 is deposited onto the barrier layer 236. The seed layer 250 can be deposited using vapor deposition techniques, such as PVD, CVD, atomic layer deposition, and/or plating. The seed layer 250 can be composed of Cu or other suitable materials. The thickness of the seed layer 250 may be about 2000 Angstroms, but could be more or less depending upon the depth and aspect ratio of the hole 245. In several embodiments, the seed layer 250 may not uniformly cover the barrier layer 236 such that the seed layer 250 has voids 251 within the hole 245. This can cause non-uniform electroplating in the hole 245 and across the workpiece. When the seed layer 250 is deficient, it is preferably enhanced the seed layer 250 to form a more uniform seed layer. Referring to FIG. 2J, for example, voids 251 and/or non-continuous regions of the seed layer 250 have been filled with additional material 252, such as copper or another suitable material. One suitable seed layer enhancement process is described in U.S. Pat. No. 6,197,181, which is incorporated by reference.

Figure 2K:
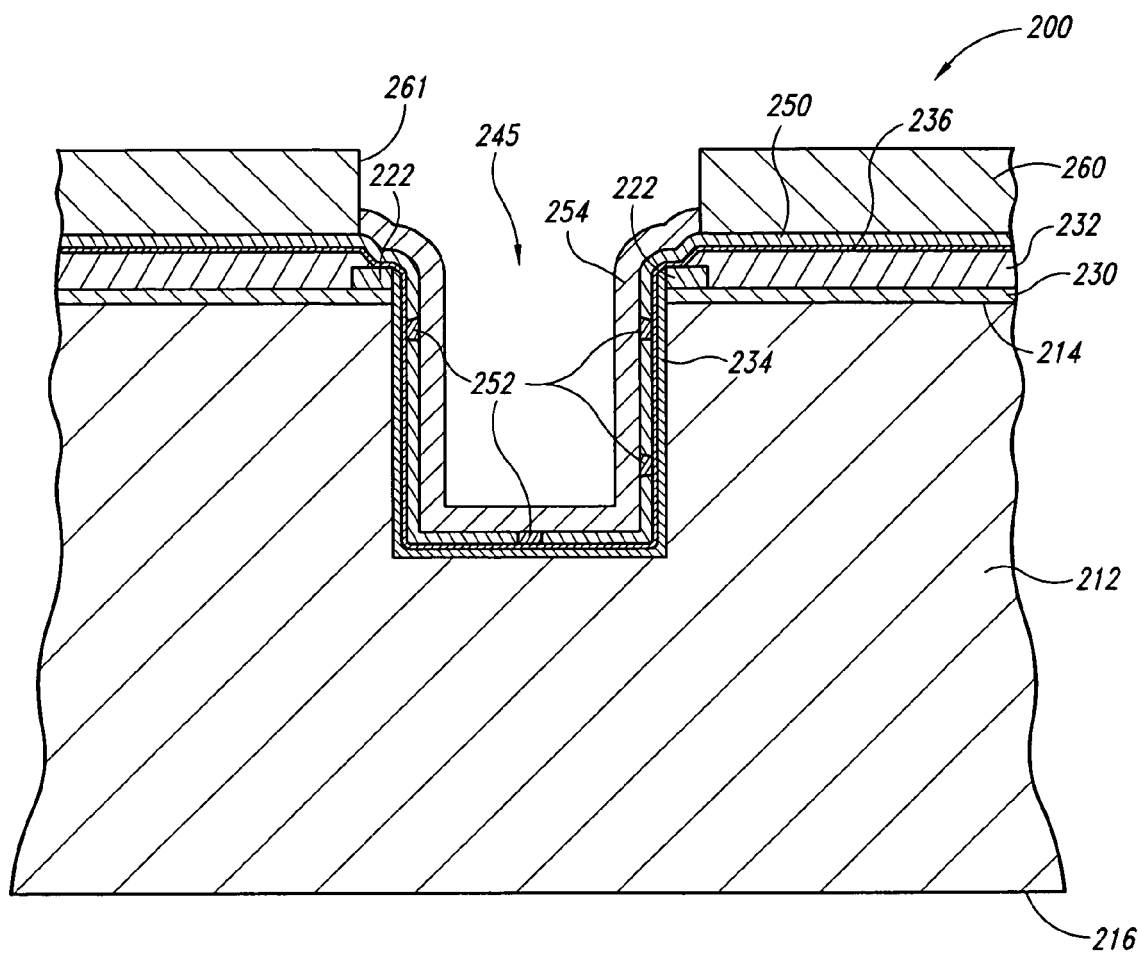

Referring next to FIG. 2K, a resist layer 260 is deposited onto the seed layer 250 and patterned to have an opening 261 over the terminal 222 and corresponding blind hole 245. A first conductive layer 254 is then deposited onto the exposed portions of the seed layer 250 in the blind hole 245. The first conductive layer 254 can be Cu that is deposited onto the seed layer 250 in an electroless plating operation, electroplating operation, or another suitable method. In the illustrated embodiment, the thickness of the first conductive layer 254 is about 1 micron. In other embodiments, the first conductive layer 254 may include other suitable materials and/or have a different thickness.

Figure 2L:
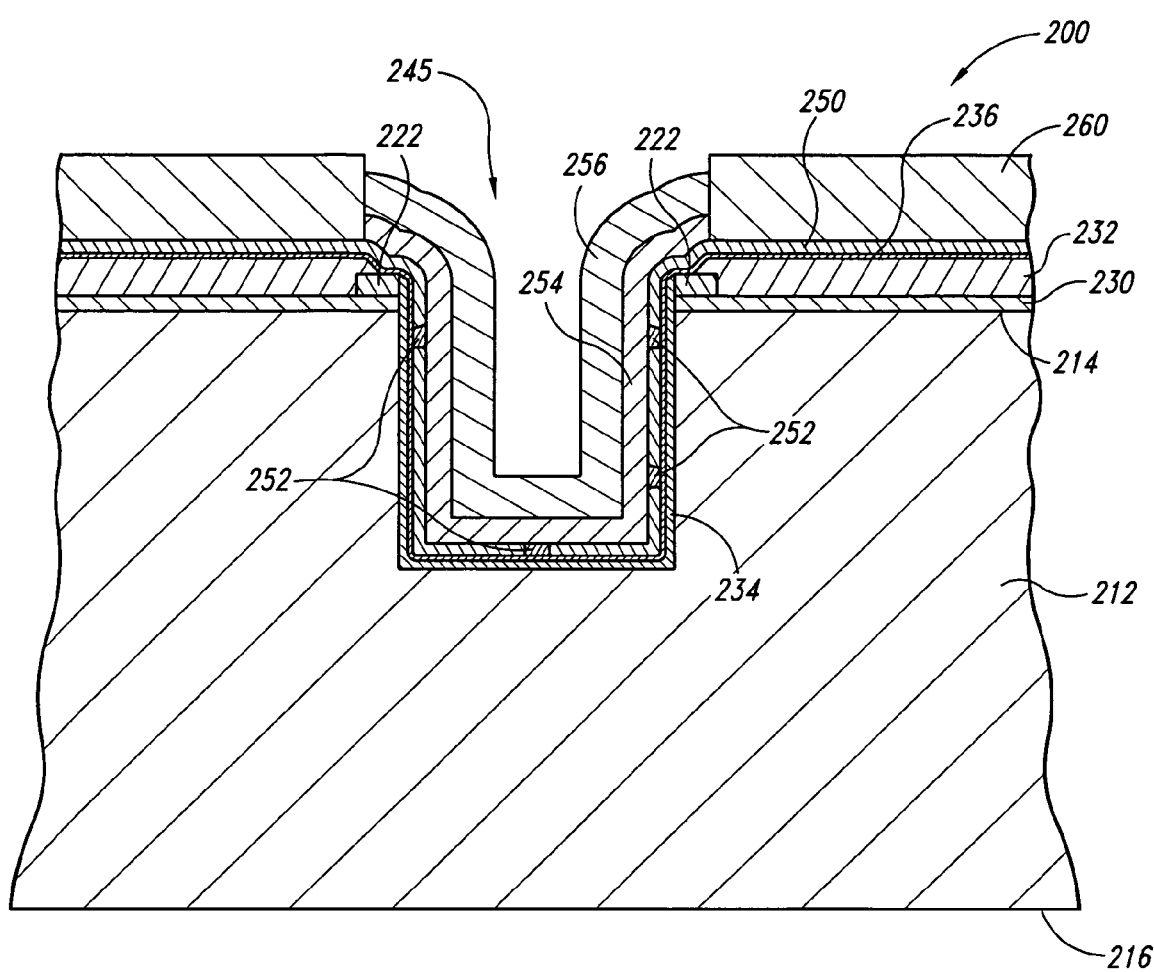

Referring to FIG. 2L, a second conductive layer 256 is deposited onto the first conductive layer 254 in the blind hole 245. The second conductive layer 256 is a wetting agent that facilitates depositing subsequent materials into the blind hole 245. The second conductive layer 256 can be Ni that is deposited onto the first conductive layer 254 using an electroless or electrolytic plating process. In the illustrated embodiment, the thickness of the second conductive layer 256 is approximately 3-5 microns. In other embodiments, the blind hole 245 may be coated with other suitable materials using other methods and/or have a different thickness.

Figure 2M:
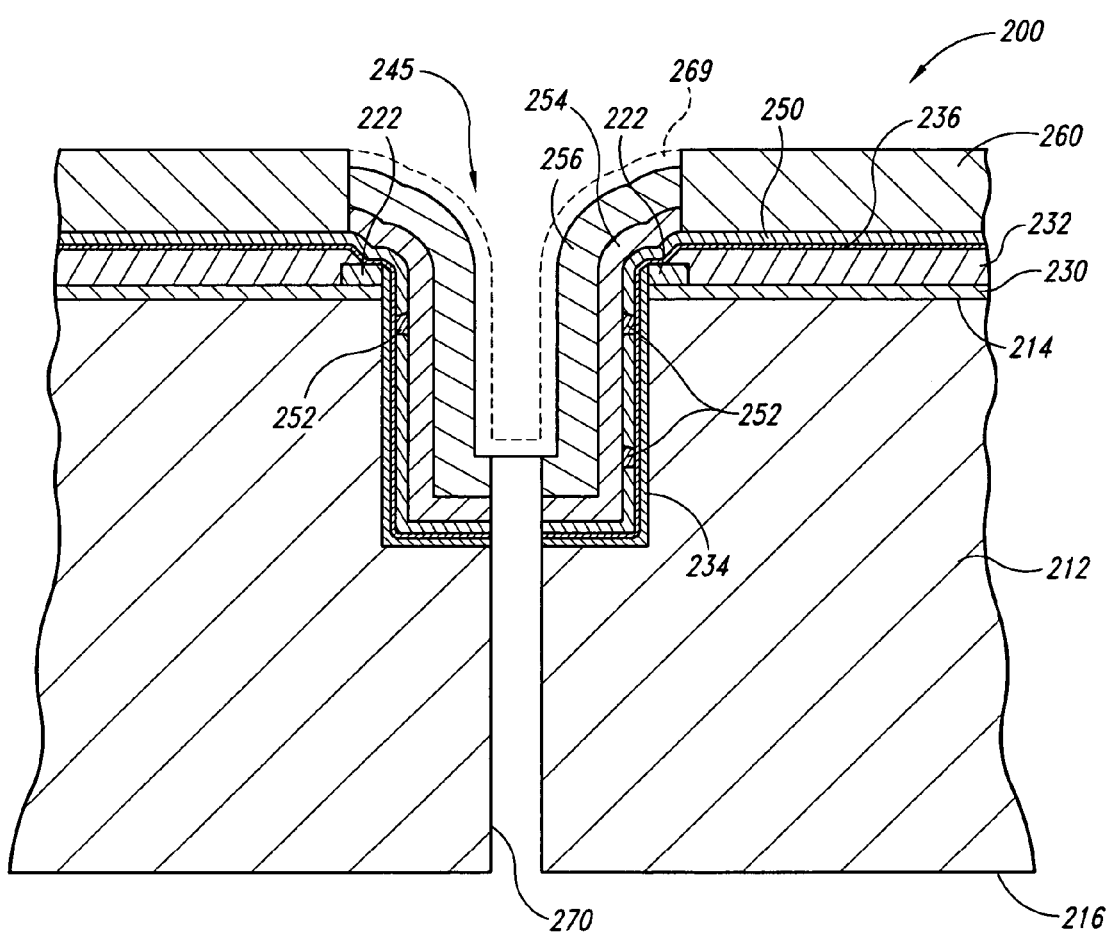

Referring next to FIG. 2M, a vent hole 270 is formed in the substrate 212 extending from a bottom portion of the blind hole 245 to the second side 216 of the substrate 212. The vent hole 270 can be formed using a laser to cut through the substrate 212 from the second side 216 to the bottom of the blind hole 245. The laser can be aligned with the blind hole 245 and/or corresponding terminal 222 using scanning/alignment systems known in the art. A suitable laser is the Xise200 commercially available from Xsil Ltd. of Dublin, Ireland. After forming the vent hole 270, it is generally cleaned to remove ablated byproducts (i.e., slag) and/or other undesirable byproducts resulting from the laser. For example, the vent hole 270 can be cleaned using a suitable cleaning agent, such as 6% tetramethylammonium hydroxide (TMAH): propylene glycol. In other embodiments, the vent hole 270 may not be cleaned. In alternative embodiments, the vent hole 270 can be a different size or shape, and may be formed using an etching process (e.g., a dry etch and/or a wet etch), a mechanical drilling process, a dicing or laser slot, or another suitable method.

In several embodiments, a temporary protective filling or coating 269 (shown in broken lines) can be deposited into the blind hole 245 before forming the vent hole 270. The protective filling 269 can be a photoresist, a polymer, water, a solidified liquid or gas, or another suitable material. The protective filling 269 protects the sidewalls of the blind hole 245 from slag produced during the laser drilling process. The slag can negatively affect the plating of Ni onto the seed layer and/or the wetting of a conductive fill material into the blind hole 245. The protective filling 269 can be removed after forming the vent hole 270.

Figure 2N:
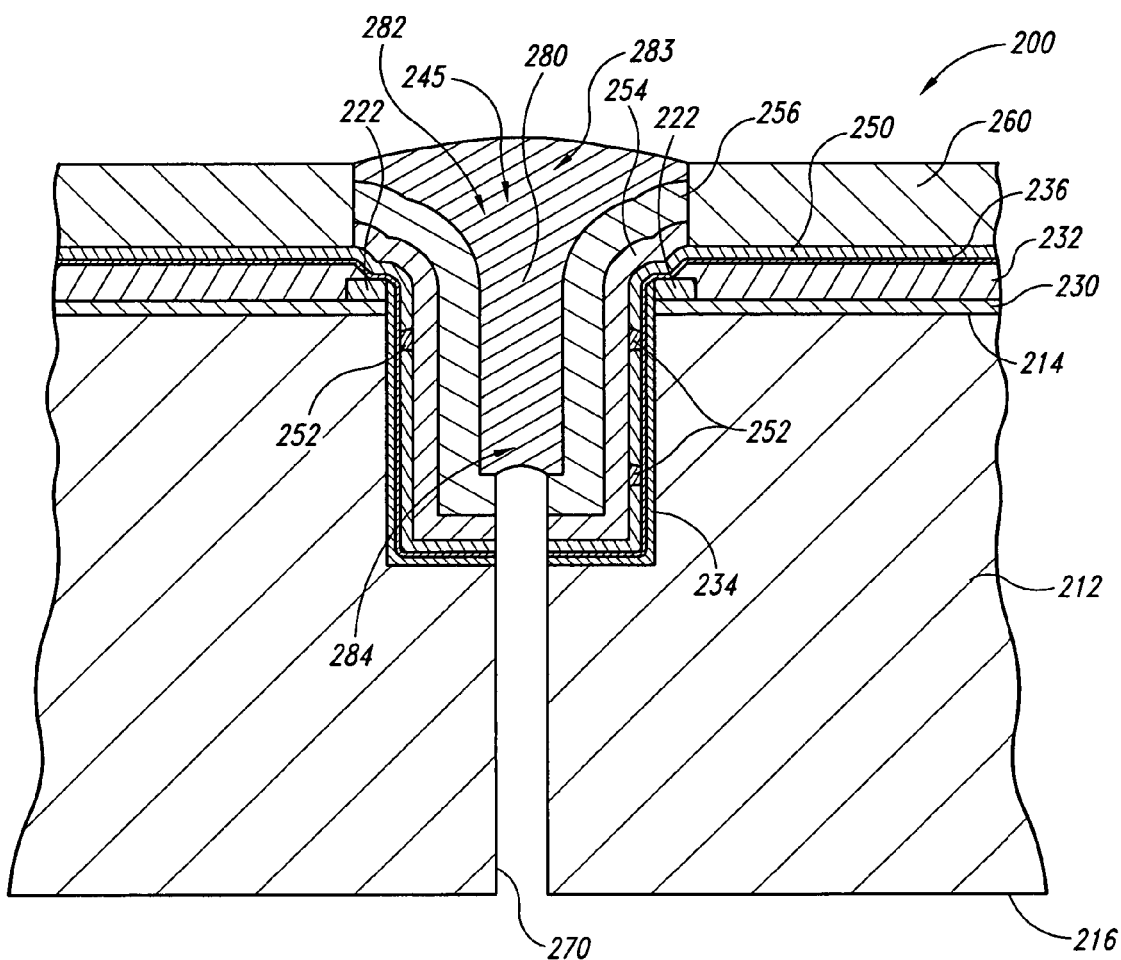
Figure 20:
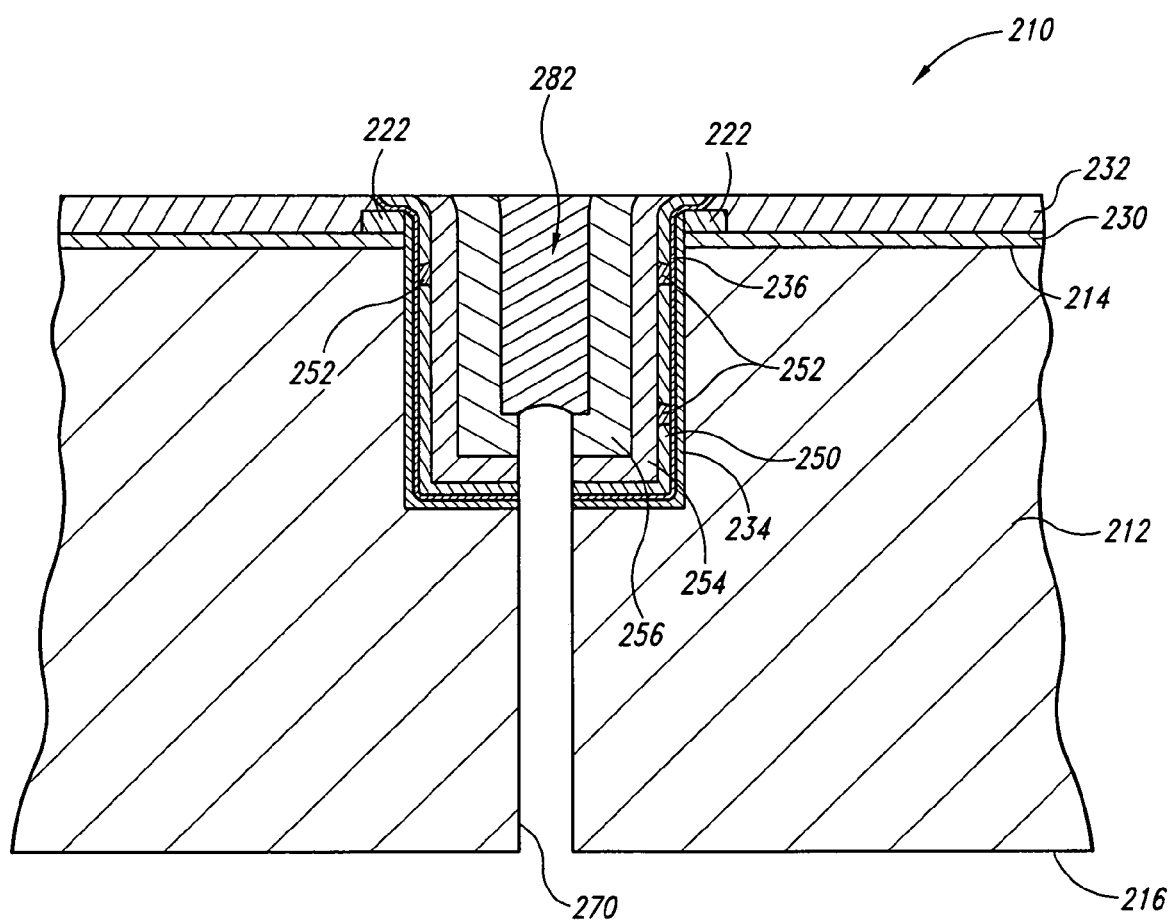

Referring next to FIG. 2N, a conductive fill material 280 is deposited into the blind hole 245 to form an interconnect 282. The interconnect 282 has a first end 283 proximate to the terminal 222 and a second end 284 at the bottom of the blind hole 245. The fill material 280 can include Cu, Ni, Co, Ag, Au, SnAgCu solder, AuSn solder, a solder having another composition, or other suitable materials or alloys of materials having the desired conductivity. The conductive fill material 280 can be deposited into the blind hole 245 using plating processes, solder wave processes, screen printing processes, reflow processes, vapor deposition processes, or other suitable techniques. The plating processes, for example, can be electroless plating processes or electroplating processes. In several embodiments, the barrier layer 236 and/or seed layer 250 can be used as electroplating contacts.

Referring to FIG. 2O, the resist layer 260 is removed from the substrate 212 and a suitable etching process is used to remove the remaining portions of the seed layer 250 and barrier layer 236 on the first side 214 of the substrate 212. The first side 214 of the substrate 212 can be planarized using grinding, chemical mechanical planarization (CMP), and/or other suitable processes.

One advantage of several embodiments of the method for forming interconnects 282 illustrated in FIGS. 2A-2O is that the vent hole 270 allows trapped air, gases, or volatile solvents to escape from the larger blind hole 245 when filling the blind hole with the fill material 280. In this way, the vent hole 270 allows the fill material 280 to more easily flow into the blind hole 245 and mitigates the likelihood of voids or discontinuities in the interconnect 282. Alternatively, the vent hole 270 may be omitted in embodiments in which a vacuum reflow fill method is used. The vacuum reflow fill method removes trapped air from the blind hole 245 while filling the blind hole with the fill material 280, thus providing several of the same benefits as the vent hole 270.

D. Methods for Shielding Dark Current Pixels on Imager Workpieces

FIGS. 3-6B illustrate stages in a method for shielding dark current pixels on the imager workpiece 200 in accordance with an embodiment of the method 100 (FIG. 1) described above. FIG. 3, for example, is a side cross-sectional view of the imager workpiece 200 after forming a plurality of interconnects 282 in the substrate 212. The interconnects 282 can be formed using the methods described above with respect to FIGS. 2A-2O.

As discussed previously, each die 220 includes an image sensor 224. The individual image sensors 224 include an array of pixels 225 arranged in a focal plane. In the illustrated embodiment, for example, the image sensors 224 include a plurality of active pixels 225a arranged in a desired pattern and at least one dark current pixel 225b at a perimeter portion of the image sensor 224. In other embodiments, the arrangement of pixels 225 may be different.

A CFA 310 is formed over the active pixels 225a of each image sensor 224 on the workpiece 200. The CFA 310 has individual filters 311 configured to allow the wavelengths of selected colors (e.g., red, green, or blue) to pass to each pixel 225 by placing a filter 311 of that color over the corresponding pixel 225. As photons pass through the CFA 310 to reach the pixels 225, only wavelengths of that color will pass through to the active pixels 225a. In the illustrated embodiment, for example, the CFA 310 is based on the RGB color model, and includes red filters, green filters, and blue filters arranged in a desired pattern over corresponding active pixels 225a. The CFA 310 further includes a residual blue section 312 that extends outwardly from a perimeter portion of the image sensor 224 across the first side 214 of the substrate 212. The residual blue section 312 on the substrate 212 helps prevent back reflection from the various components within the workpiece 200. Portions of the residual blue section 312 over the terminals 222 and in the lanes between the individual dies 220 have been removed.

After forming the CFA 310 over the image sensors 224, a plurality of microlenses 314 are formed over the corresponding pixels 225 on the image sensors 224. The microlenses 314 are used to focus light onto the initial charge accumulation regions of the individual pixels 225. An oxide coating (not shown) can then be deposited over the microlenses 314 to protect the microlenses 314, CFA 310, and pixels 225 during further processing of the workpiece 200. In several embodiments, the oxide coating can include a low temperature CVD oxide. In other embodiments, the oxide coating can include other suitable materials. In alternative embodiments, the oxide coating may not be included. After depositing the oxide coating onto the microlenses 314, a removable cover layer 320 can be deposited across the workpiece 200. The removable cover layer 320 can include a photoresist or other selectively removable substance. Accordingly, portions of the cover layer 320 can be selectively removed (as described below with respect to FIGS. 4A and 4B) using a masking process or other suitable process. In one embodiment, for example, the cover layer 320 can be a layer of resist that is deposited onto the first side 214 of the substrate 212.

Figure 4B:
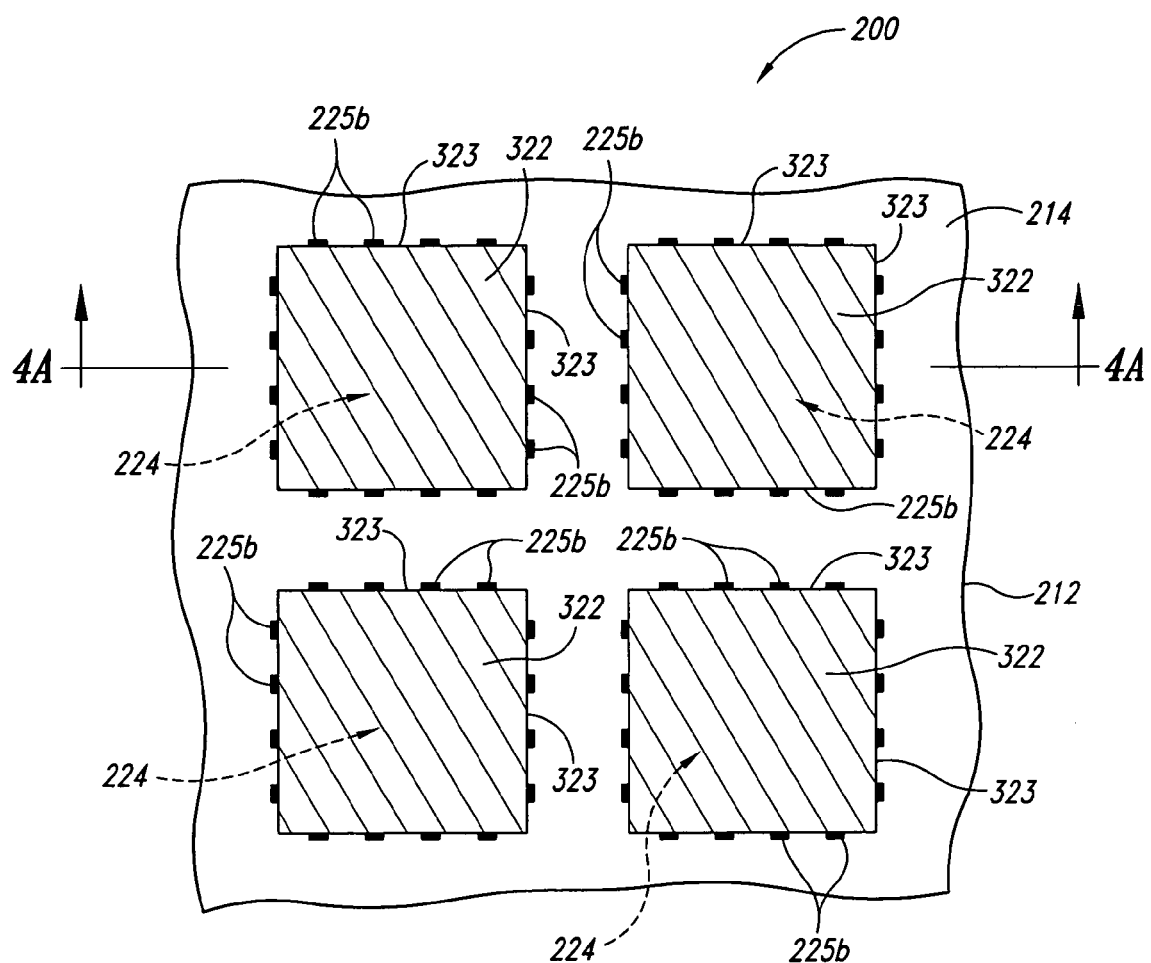
FIG. 4B is a schematic top plan view of the portion of the workpiece illustrated in FIG. 4A.

FIG. 4A is a side cross-sectional view of the workpiece 200 after patterning and developing the cover layer 320 (FIG. 3) to form a plurality of discrete volumes or blocks 322 of cover layer material on the workpiece 200. FIG. 4B is a schematic top plan view of the portion of the workpiece 200 showing the location of the cross-section illustrated in FIG. 4A. Referring to FIGS. 4A and 4B together, the blocks 322 are over the individual image sensors 224 on the substrate 212 and have sidewalls 323. More specifically, the individual blocks 322 cover the active pixels 225a of the individual image sensors 224, and the sidewalls 323 are aligned with an inboard edge of the corresponding dark current pixels 225b of each image sensor 224 such that the dark current pixels 225b are not covered by the blocks 322. One feature of this embodiment is that the sidewalls 323 of the individual blocks 322 can be defined very accurately to expose only the dark current pixels 225b at the perimeter portion of the image sensors 224. In several embodiments, for example, the sidewalls 323 of the blocks 322 can be aligned with the inboard edges of corresponding dark current pixels 225b to within tolerances of several tenths of a micron or less.

Referring next to FIG. 5, an opaque material 330 is deposited onto the workpiece 200 to (a) shield the dark current pixels 225b of the image sensors 224, and (b) form a plurality of stand-offs on the workpiece 200 for a cover substrate (FIG. 7) that is subsequently attached to the workpiece 200. For purposes of this specification, "opaque" is defined as being sufficiently non-transmissive of a desired radiation. Before depositing the opaque material 330, the residual blue section 312 (FIG. 4A) of the CFA 310 at the perimeter portion of each image sensor 224 can be removed. The residual blue section 312 is preferably removed from the workpiece 200 so that (a) the opaque material 330 will bond more readily to the second dielectric layer 232 (FIG. 2A) on the substrate 212, and (b) the opaque material 330 will be in close proximity to the corresponding dark pixels 225b. The opaque material 330 can be an epoxy material that is deposited onto the workpiece 200 between the individual blocks 322. The opaque material 330 includes a top surface 332 and sidewalls 334 in intimate contact with the sidewalls 323 of corresponding blocks 322. After depositing the opaque material 330 onto the workpiece 200, a top surface 324 of the blocks 322 and the top surface 332 of the opaque material 330 can be planarized using CMP, grinding, etching, or other suitable processes.

Figure 6B:
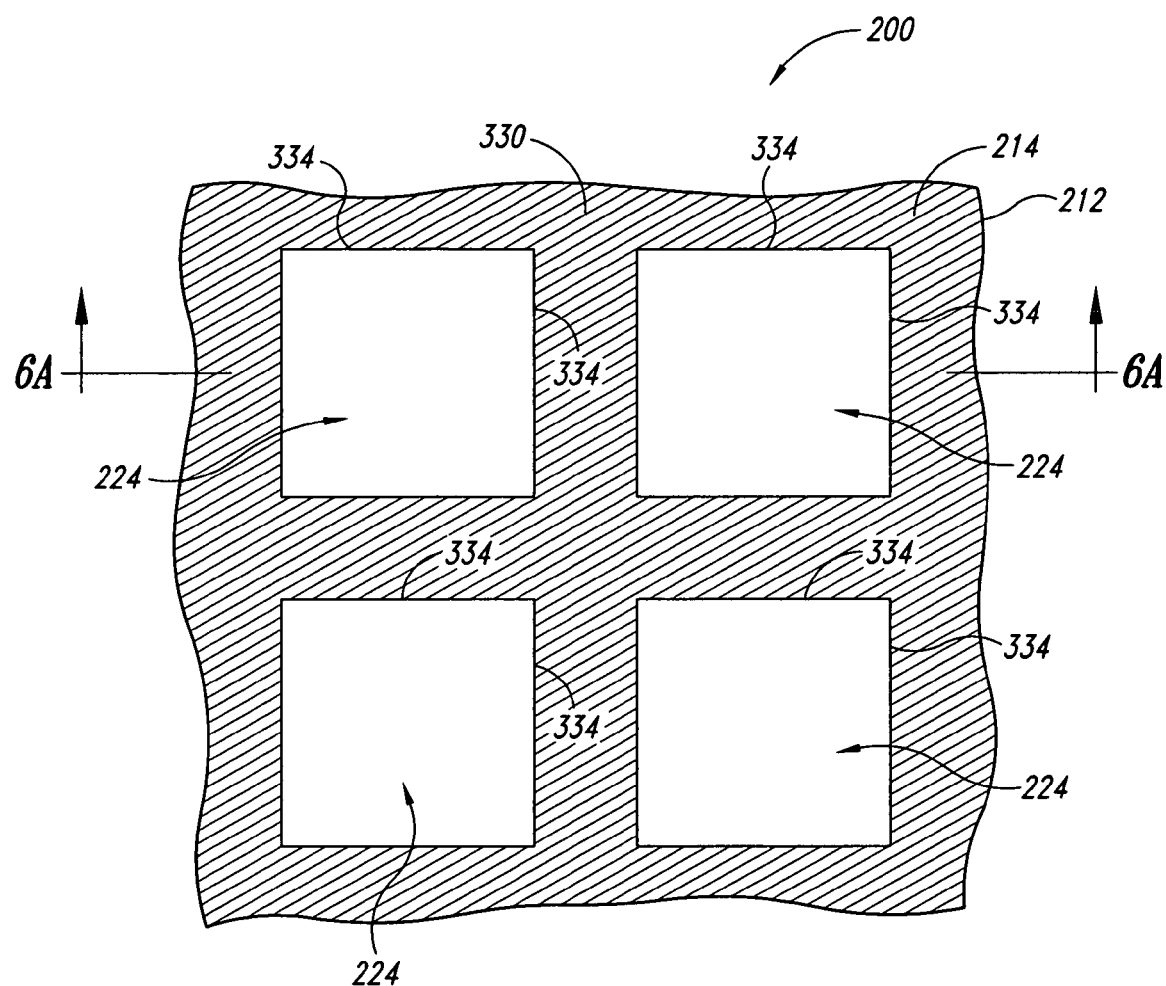
FIG. 6B is a schematic top plan view of the portion of the workpiece illustrated in FIG. 6A.

FIG. 6A is a side cross-sectional view of the workpiece 200 after removing the blocks 322 from the workpiece 200, and FIG. 6B is a schematic top plan view of the portion of the workpiece 200 illustrated in FIG. 6A. Referring to FIGS. 6A and 6B together, the sidewalls 334 of the opaque material 330 are aligned with an inboard edge of the corresponding dark pixels 225b (as shown by lines A-A) of each image sensor 224. Thus, the dark pixels 225b of the image sensors 224 are shielded from incident light directed at the active pixels 225a of the image sensors 224 and cannot scavenge signal from the incident light. In this way, the dark current signal measured by the dark current pixels 225b will represent the true dark signal of the corresponding image sensors 224.

One feature of the method described above with respect to FIGS. 3-6B is that the sidewalls 323 of the blocks 322 of cover layer material can be precisely aligned with an inboard edge of the individual dark current pixels 225b so that there is no need to move the dark current pixels 225b any further outboard of the active pixels 225a to prevent scavenging. In conventional devices, the dark current pixels are generally positioned a substantial distance outboard of the active pixels of the image sensor to ensure proper shielding. This results in a significantly larger footprint for conventional imaging units. An advantage of the method described above is that the footprint of the individual image sensors 224 can be minimized or at least reduced while still providing adequate shielding to prevent scavenging. The reduced footprint is particularly advantageous for picture cell phones, PDAs, or other applications where space is limited. Therefore, several embodiments of the method are expected to significantly improve the performance of image sensors and reduce the size of packaged microelectronic imaging units.

E. Wafer-Level Packaged Microelectronic Imaging Units

Figure 7:
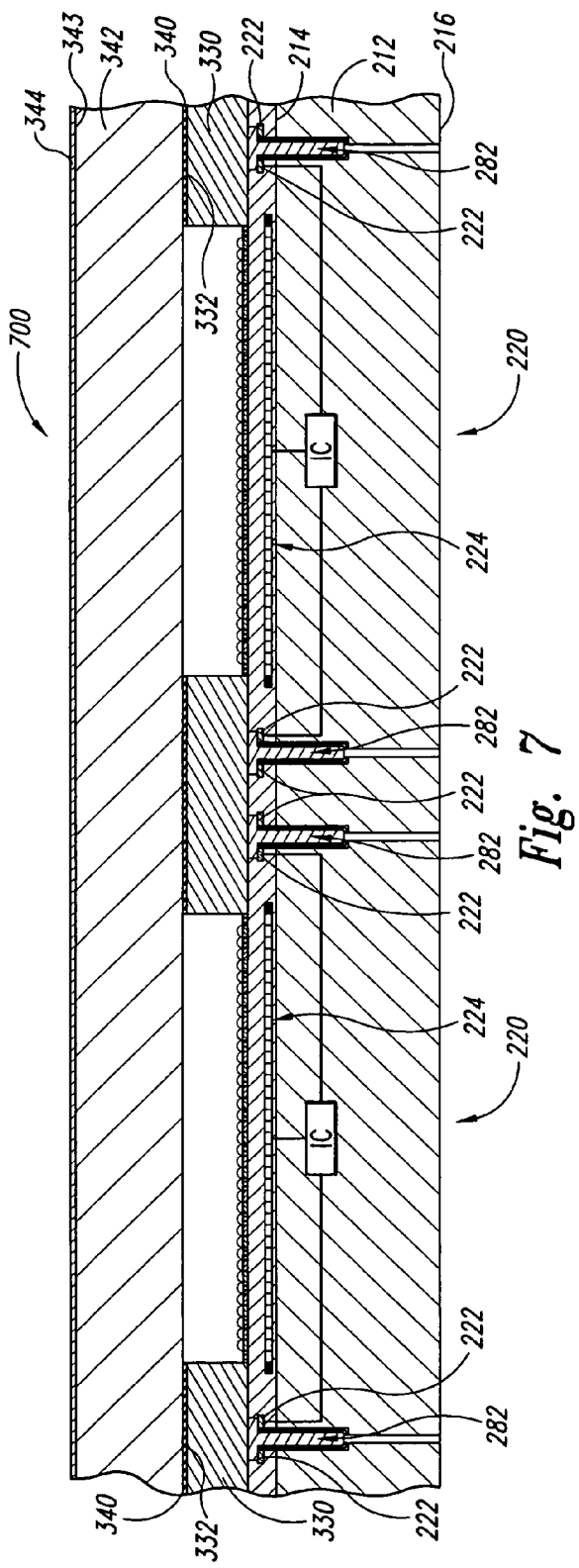
FIG. 7 is a side cross-sectional view of the portion of the workpiece after attaching a cover substrate to the workpiece.

FIGS. 7-16 illustrate subsequent stages of an embodiment of the method 100 (FIG. 1) for wafer-level packaging of microelectronic imaging units. FIG. 7, for example, is a side cross-sectional view illustrating a portion of an imager assembly 700 after attaching a cover substrate 342 to the imager workpiece. The cover substrate 342 can be glass, quartz, or another suitable material that is transmissive to the desired spectrum of radiation. The cover substrate 342 can also include one or more protective films 344 on a top surface 343 of the cover substrate 342. The film 344 can include tape, a spin-on coating, or another suitable material. The film 344 protects the cover substrate 342 from being scratched or otherwise damaged during subsequent processing steps.

The cover substrate 342 can be assembled with the workpiece 200 by depositing an adhesive 340 onto the top surface 332 of the stand-offs defined by the opaque material 330 and attaching the cover substrate 342 to the adhesive 340 and over the image sensors 224. The adhesive 340 can be an epoxy, acrylic, or another suitable material, and it can be applied to the top surface 332 of the opaque material 330 by stencil printing, photolithography, or other suitable methods. In embodiments where the adhesive 340 is a UV- or thermally-curable material, the workpiece 200 can be heated to at least partially cure (i.e., B-stage) the adhesive 340 before attaching the cover substrate 342. In alternative embodiments, the adhesive 340 may be deposited onto both the stand-offs and the cover substrate 342 before attaching the cover substrate 342.

In an alternative embodiment, the adhesive 340 can include polydimethylsiloxane (PDMS) and be deposited onto the workpiece 200 either before or after removing the blocks 322 from the workpiece (FIGS. 6A and 6B). PDMS is an adhesive material that can be activated by an $O_2$ plasma. In embodiments using PDMS, for example, after removing the blocks 322 (FIGS. 6A and 6B) from the workpiece 200, the top surface 332 of the opaque material 330 is activated for adhesion using an $O_2$ plasma. The cover substrate 342 can then be attached to the workpiece 200 as described above.

Figure 8:
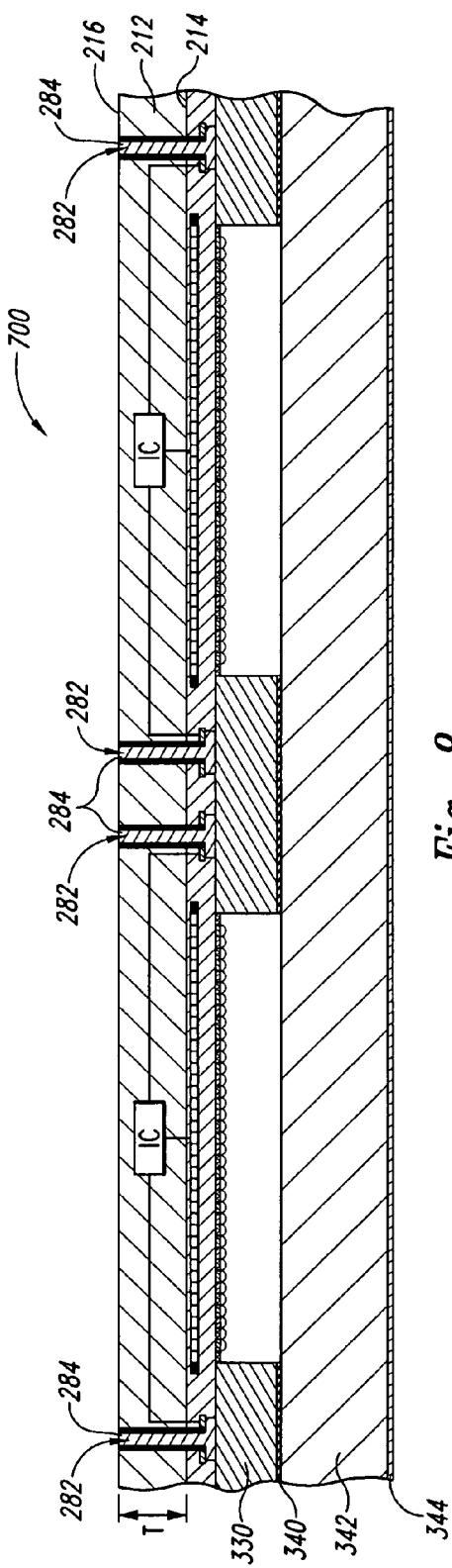
FIG. 8 is a side cross-sectional view of the portion of the workpiece after thinning the workpiece to expose a portion of the electrically conductive interconnects at a backside of the workpiece.

Referring to FIG. 8, the imager assembly 700 can be thinned to a desired thickness T to expose the second ends 284 of the interconnects 282. In one embodiment, the initial thickness of the substrate 212 is approximately 750 microns, and the final thickness T is approximately 100-500 microns. The initial and final thicknesses can be different in other embodiments. The second side 216 of the substrate 212 can be thinned using grinding, dry etching, chemical etching, chemical polishing, CMP, or other suitable processes.

In several embodiments, an optional wet TMAH etch can be used to further expose the second ends 284 of the interconnects 282 so that they protrude beyond the second side 216 of the substrate 212. In alternative embodiments, a dry etch may be used in lieu of the wet etch to further expose the second ends 284 of the interconnects 282. One advantage of the dry etch is that the imager assembly 700 does not need to be placed in an immersion bath, which can negatively affect the various protective films on the assembly 700.

Referring to FIG. 9, a fourth dielectric layer 350 can be deposited onto the second side 216 of the substrate 212. The fourth dielectric layer 350 can be a low temperature CVD oxide or another suitable dielectric material that is deposited onto the substrate 212 using the methods described above with respect to FIG. 2B. Referring next to FIG. 10, a suitable grinding or etching process can be used to remove portions of the dielectric layer 350 over the interconnects 282. In several embodiments, the dies 220 can be tested from the backside at the wafer level at this point in the packaging process. A test probe can test the individual image sensors using the interconnects 282. Accordingly, because the test probe engages the interconnects 282 on the backside of the dies 220, it will not damage the image sensors 224, cover substrate 342, or associated circuitry on the front of the imager assembly 700. Moreover, the test probe cannot obstruct the image sensors 224 during a backside test, which allows the test probe to test a larger number of imaging dies 220 at one time compared to processes that test imaging dies from the front side. Additionally, the backside test can identify imaging dies 220 that are inoperable and these dies can be removed from additional packaging processes. For example, inoperable devices can be set aside after the imaging units are singulated from the imager assembly 700 and before attaching expensive optical devices to the imaging units. Suitable methods for testing the dies 220 are disclosed in U.S. application Ser. No. 10/860,699 entitled "Systems and Methods for Testing Microelectronic Imagers and Microfeature Devices," filed on Jun. 2, 2004 and incorporated by reference herein in its entirety.

Referring to FIG. 11, a plurality of first trenches 360 are formed through the cover substrate 342 and at least a part of the opaque material 330. The first trenches 360 preferably do not extend through the opaque material 330 and are aligned with the lanes between the individual dies 220. The first trenches 360 can be formed by etching, a laser, a wafer saw, or another suitable process. Referring next to FIG. 12, the first trenches 360 are filled with a packaging material 362. In one embodiment, the packaging material 362 is SI-40 deposited into the first trenches 360 using a 3-D stereolithography process. SI-40 is commercially available from 3D Systems, Inc. of Valencia, Calif. In other embodiments, the packaging material 362 can include a thermally-cured epoxy or other suitable materials deposited using known processes. The packaging material 362 should be an opaque material or include an opaque additive to block incident light from the corresponding image sensors.

Referring to FIG. 13, a plurality of second trenches 370 are formed in the second side 216 of the substrate 212 and in alignment with the first trenches 360 (as shown by lines B-B). The second trenches 370 extend through the substrate 212, opaque material 330, and into at least a portion of the corresponding first trenches 360. The second trenches 370 have a first cross sectional dimension $D_1$ that is less than a second cross-sectional dimension $D_2$ of the first trenches. Referring next to FIG. 14, the second trenches 370 are filled with the packaging material 362 described above or another suitable material. In other embodiments, this process can be reversed such that the second trenches 370 in the substrate 212 are formed before the first trenches 360 through the cover substrate 342.

Figure 15:
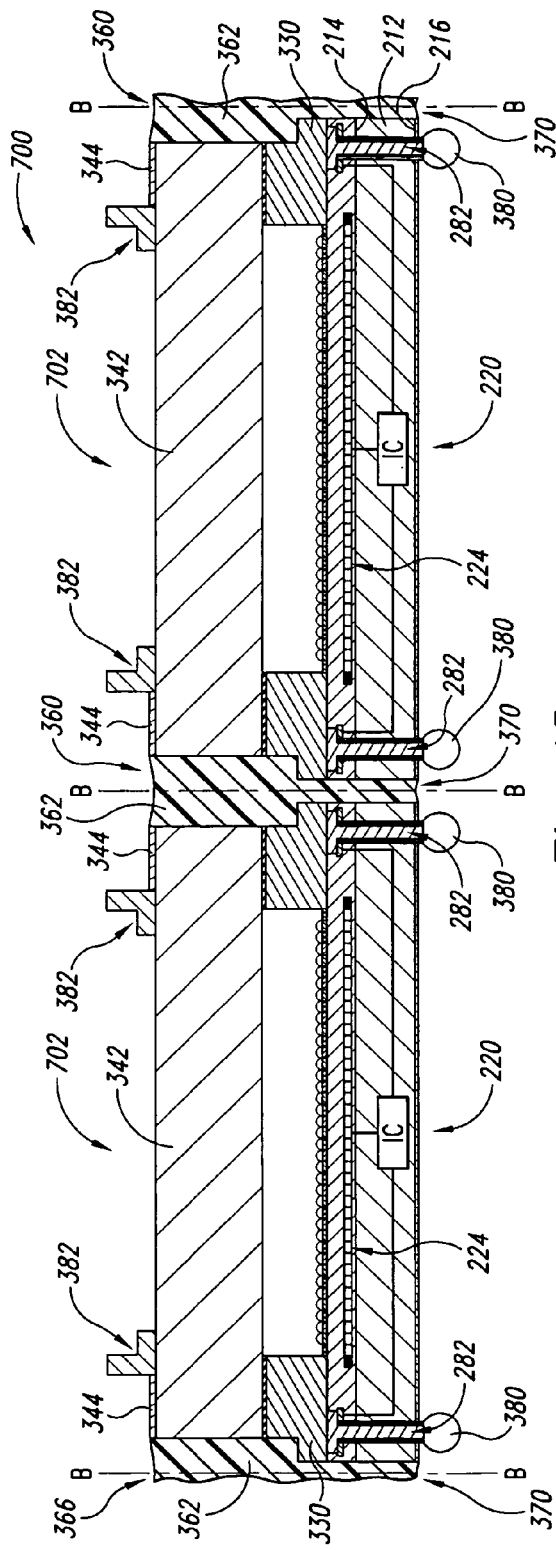
FIG. 15 is a side cross-sectional view of the portion of the workpiece after attaching a plurality of electrical couplers to corresponding interconnects at the backside of the workpiece and forming a plurality of optic support members on the cover substrate.

Referring next to FIG. 15, solder balls 380 or other external interconnect structures can be attached to the interconnects 282 at the second side 216 of the substrate 212 to provide an external connection to other electronic devices on the backside of the dies 220. Another backside test can be performed at this stage of the method before cutting the assembly. The imager assembly 700 can then be cut along lines B-B to singulate individual imaging units 702.

In another aspect of the embodiment illustrated in FIG. 15, the imaging units 702 include support members 382 on the cover substrate 342 to accurately situate an optics unit (not shown) at a desired location with respect to corresponding image sensors 224. Suitable support members 382 with corresponding interface features are disclosed in U.S. application Ser. No. 10/723,363, entitled "Packaged Microelectronic Imagers and Methods of Packaging Microelectronic Imagers," filed on Nov. 26, 2003, and incorporated by reference herein in its entirety. Portions of the protective film 344 on the cover substrate 342 and over the image sensors 224 can be removed either before or after attaching the support members 382 to the cover substrate 342. Optics units can be attached to the corresponding support member 382 at the wafer level or to individual imaging units 702 after singulation. In other embodiments, the support members 382 can have a different configuration or the imaging units 702 may not include support members 382.

Figure 16:
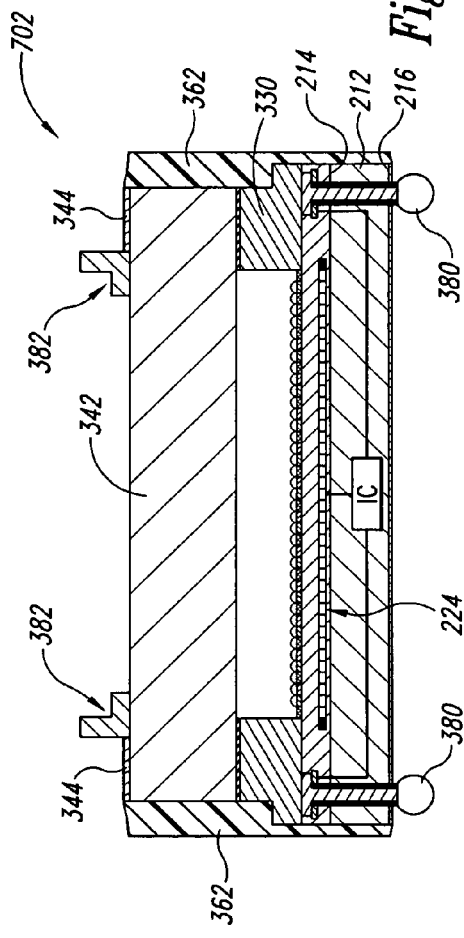
FIG. 16 is a side cross-sectional view of a packaged microelectronic imaging unit in accordance with an embodiment of the invention.

FIG. 16 is a side cross-sectional view of a packaged microelectronic imaging unit 702 in accordance with an embodiment of the invention. The individual imaging units 702 can be tested from the backside before attaching optics units (not shown) to the imaging units. One feature of the imaging unit 702 illustrated in FIG. 16 is that the packaging material 362 seals the four sides of the imaging unit 702, and the cover substrate 342 and substrate 212 seal the top and bottom, respectively, of the imaging unit 702. In this way, there is no path for moisture or other contaminants to enter the imaging unit 702 and cause the image sensor 224 or associated circuitry to malfunction and/or become inoperable.

One feature of the method for manufacturing imaging units 702 illustrated in FIGS. 2A-16 is that the method is expected to significantly enhance the efficiency of the manufacturing process because a plurality of imaging units 702 can be fabricated simultaneously using highly accurate and efficient processes developed for packaging and manufacturing semiconductor devices. This method of manufacturing imaging units 702 is also expected to enhance the quality and performance of the imaging units 702 because the semiconductor fabrication processes can reliably produce and assemble the various components with a high degree of precision. As such, several embodiments of the method are expected to significantly reduce the cost for assembling microelectronic imaging units 702, increase the performance of the imaging units 702, and produce higher quality imaging units 702.

From the foregoing, it will be appreciated that specific embodiments of the invention have been described herein for purposes of illustration, but that various modifications may be made without deviating from the spirit and scope of the invention. For example, the microelectronic imaging units can have any combination of the features described above with respect to FIG. 2A-16. Accordingly, the invention is not limited except as by the appended claims.

We claim:

1. A method of manufacturing a plurality of microelectronic imaging units, the method comprising:
   providing an imager workpiece having a plurality of imaging dies including integrated circuits, external contacts electrically coupled to the integrated circuits, and image sensors operably coupled to the integrated circuits, the individual image sensors including a plurality of active pixels and at least one dark current pixel at a perimeter portion of the image sensor;
   depositing a cover layer onto the workpiece and over the image sensors;
   patterning and selectively developing the cover layer to form discrete volumes of cover
   layer material over corresponding image sensors;
   depositing an opaque material onto the workpiece between the discrete volumes of cover layer material and over the dark current pixels, the opaque material having sidewalls aligned with an inboard edge of the individual dark current pixels such that the active pixels of the image sensor are not covered by the opaque material and such that the dark current pixels are covered by the opaque material; and
   removing the discrete volumes of cover layer material from the workpiece.

2. The method of claim 1, further comprising planarizing a top surface of the opaque material and/or the cover layer material before removing the cover layer material from the workpiece.

3. The method of claim 1 wherein depositing an opaque material onto the workpiece comprises depositing an epoxy material.

4. The method of claim 1 wherein providing a plurality of imaging dies having image sensors comprises providing image sensors having (a) an array of active pixels in a desired pattern, and (b) a plurality of dark current pixels around the perimeter portion of the image sensors, and wherein the inboard edges of the dark current pixels are adjacent to at least one active pixel, and wherein the method further comprises: constructing color filter arrays (CFAs) on the workpiece and over corresponding image sensors; and planarizing a top surface of the opaque material and the cover layer after depositing the opaque material onto the workpiece and before removing the cover layer from the workpiece.

5. The method of claim 4, further comprising forming microlenses over the CFAs on the image sensors before depositing the cover layer onto the workpiece.

6. The method of claim 4, further comprising depositing an oxide coating over the microlenses before depositing the cover layer onto the workpiece.

7. The method of claim 4, further comprising stripping away residual blue portions of the CFAs at a perimeter portion of the image sensors after depositing the cover layer and before depositing the opaque material onto the workpiece.

8. The method of claim 1 wherein providing a plurality of imaging dies having image sensors comprises forming image sensors having (a) an array of active pixels in a desired pattern, and (b) a plurality of dark current pixels around the perimeter portion of the image sensors, and wherein the inboard edges of the dark current pixels are adjacent to at least one active pixel.

9. The method of claim 8, further comprising:
   constructing CFAs on the workpiece and over corresponding image sensors;
   forming microlenses over the CFAs on the image sensors; and
   depositing an oxide coating over the microlenses before depositing the cover layer onto the workpiece.

10. The method of claim 1 wherein the discrete volumes of cover layer material comprise blocks of cover layer material over the image sensors.

11. The method of claim 1 wherein providing the external contacts comprises constructing electrically conductive interconnects in contact with corresponding terminals and extending through at least a portion of the individual dies.

12. The method of claim 1 wherein depositing a cover layer onto the workpiece comprises depositing a layer of resist onto the workpiece and over the image sensors.

13. The method of claim 1 wherein the external contacts comprise terminals at a front side of the workpiece and interconnects extending through at least a portion of the workpiece, and wherein the method further comprises:
   planarizing a top surface of the opaque material before removing the cover layer to define a plurality of stand-offs on the workpiece;
   attaching a cover substrate to the stand-offs and over the image sensors on the workpiece, wherein the cover substrate is transmissive to a desired radiation;
   removing material from a backside of the workpiece to thin the workpiece and expose at least a portion of the interconnects;
   forming first trenches in the cover substrate and at least a portion of the stand-offs,
   wherein the first trenches are aligned with lanes separating the individual dies on the workpiece; depositing a packaging material into the first trenches;
   forming second trenches in the backside of the workpiece and aligned with the first trenches;

depositing the packaging material into the second trenches; and cutting the workpiece in alignment with the first and second trenches to singulate the imaging units.

14. A method of manufacturing a plurality of microelectronic imaging units, the method comprising:
providing an imager workpiece having a plurality of imaging dies including integrated circuits, external contacts electrically coupled to the integrated circuits, and image sensors operably coupled to the integrated circuits, the individual image sensors including at least one dark current pixel at a perimeter portion of the image sensor;
forming discrete blocks of photoactive material over corresponding image sensors, the discrete blocks having sidewalls aligned with corresponding inboard edges of the individual dark current pixels such that the dark current pixels are not covered by the discrete blocks;
depositing an opaque material onto the workpiece and over the dark current pixels; and
removing the discrete blocks of photoactive material from the workpiece.

15. The method of claim 14, further comprising planarizing a top surface of the opaque material and discrete blocks of photoactive material before removing the photoactive blocks from the workpiece.

16. The method of claim 14 wherein depositing an opaque material onto the workpiece comprises depositing an epoxy material.

17. The method of claim 14 wherein providing a plurality of imaging dies having image sensors comprises providing image sensors having (a) an array of active pixels in a desired pattern, and (b) a plurality of dark current pixels around the perimeter portion of the image sensors, and wherein the inboard edges of the dark current pixels are adjacent to at least one active pixel, and wherein the method further comprises:
constructing CFAs on the workpiece and over corresponding image sensors;
forming microlenses over the CFAs on the image sensors; and
planarizing a top surface of the opaque material and photoactive layer before removing the photoactive layer from the workpiece.

18. The method of claim 17, further comprising depositing an oxide coating over the microlenses before depositing the photoactive material onto the workpiece.

19. The method of claim 17, further comprising stripping away residual blue portions of the CFAs at a perimeter portion of the image sensors after depositing the photoactive layer and before depositing the opaque material onto the workpiece.

20. The method of claim 14 wherein providing a plurality of imaging dies having image sensors comprises forming image sensors having (a) an array of active pixels in a desired pattern, and (b) a plurality of dark current pixels around the perimeter portion of the image sensors, and wherein the inboard edges of the dark current pixels are adjacent to at least one active pixel.

21. The method of claim 20, further comprising:
constructing CFAs on the workpiece and over corresponding image sensors;
forming microlenses over the CFAs on the image sensors; and
depositing an oxide coating over the microlenses before depositing the photoactive material onto the workpiece.

22. The method of claim 14 wherein the discrete volumes of photoactive material comprise blocks of photoactive material over the image sensors.

23. The method of claim 14 wherein providing the external contacts comprises constructing electrically conductive interconnects in contact with corresponding terminals and extending through at least a portion of the individual dies.

24. A method of manufacturing an imaging die, the method comprising:
constructing an array of pixels on and/or in a substrate, the array of pixels including a dark pixel at a perimeter portion of the array and an active pixel adjacent to an inboard edge of the dark pixel;
depositing a photoactive layer onto the substrate and over the array of pixels;
patterning the photoactive layer;
selectively developing the photoactive layer to form a discrete block of photoactive material over the array of pixels, the discrete block having a sidewall aligned with the inboard edge of the dark pixel such that the dark pixel is not covered by the discrete block and the active pixel is completely covered by the discrete block;
depositing an opaque material onto the substrate and over the dark pixel to shield the dark pixel from light directed toward the active pixels; and
removing the photoactive block from the substrate.

25. The method of claim 24, further comprising planarizing a top surface of the opaque material and the discrete block of photoactive material before removing the photoactive block from the substrate.

26. The method of claim 25 wherein depositing an opaque material onto the workpiece comprises depositing an epoxy material.

27. The method of claim 25, further comprising:
forming a CFA over the array of active pixels;
constructing microlenses over the CFA and corresponding active pixels; and
planarizing a top surface of the opaque material and photoactive block before removing the photoactive block from the workpiece.

28. The method of claim 27, further comprising depositing an oxide coating over the microlenses before depositing the photoactive material onto the workpiece.

29. A method of manufacturing a plurality of microelectronic imaging units on an imager workpiece, the imager workpiece including a substrate and a plurality of imaging dies in and!or on the substrate, the individual imaging dies including an integrated circuit, external contacts electrically coupled to the integrated circuitry, and an image sensor operably coupled to the integrated circuit, the image sensor including an array of active pixels in a desired pattern and a plurality of dark pixels along a perimeter portion of the image sensor, wherein the method comprises:
depositing a photoactive layer onto the workpiece and over the image sensors;
patterning the photoactive layer;
selectively developing the photoactive layer to form discrete blocks of photoactive material over corresponding image sensors, the discrete blocks having sidewalls aligned with an inboard edge of the individual dark pixels such that the sidewalls define a border between the active pixels and the dark pixels of the individual image sensors;
depositing an opaque epoxy material onto the workpiece and into the gaps between the discrete blocks of photoactive material, wherein the epoxy material covers the individual dark pixels; and
removing the discrete blocks of photoactive material from the workpiece.

30. The method of claim 29 further comprising planarizing a top surface of the opaque epoxy material and the blocks of photoactive material before removing the photoactive material from the workpiece.

31. The method of claim 29 further comprising:
   forming CFAs on the workpiece and over corresponding image sensors;
   constructing microlenses over the CFAs on the image sensors before depositing the photoactive layer onto the workpiece; and
   planarizing a top surface of the opaque material and photoactive layer after depositing the opaque epoxy material onto the workpiece and before removing the photoactive layer from the workpiece.

32. The method of claim 29 wherein depositing a photoactive layer onto the workpiece comprises depositing a layer of resist onto the workpiece and over the image sensors.

33. The method of claim 29 wherein the opaque epoxy material deposited onto the workpiece defines a plurality of stand-offs on the workpiece, and wherein the method further comprises:
   attaching a cover substrate to the stand-offs and over the image sensors;
   forming first trenches in the cover substrate and at least a portion of the stand-offs, wherein the first trenches are aligned with lanes separating the individual dies on the workpiece;
   depositing a packaging material into the first trenches;
   forming second trenches in the backside of the workpiece and aligned with the first trenches;
   depositing the packaging material into the second trenches; and
   cutting the workpiece in alignment with the first and second trenches to singulate the imaging units.

34. A method of manufacturing a plurality of microelectronic imaging units, the method comprising:
   constructing an imager workpiece having a plurality of imaging dies including integrated circuits, external contacts electrically coupled to the integrated circuits, and image sensors operably coupled to the integrated circuits, the individual image sensors including at least one dark current cell at a perimeter portion of the image sensor;
   depositing a resist layer onto the workpiece and over the image sensors;
   patterning and selectively developing the resist layer to form discrete blocks of resist material over corresponding image sensors, the discrete blocks having sidewalls aligned with corresponding inboard edges of the individual dark current cells such that the dark current cells are not covered by the discrete blocks;
   depositing an opaque material onto the workpiece and over the dark current cells to shield the dark current cells from light directed toward the image sensors; and
   removing the discrete blocks of resist material from the workpiece.

* * * * *